(12) United States Patent
Kim et al.

(10) Patent No.: US 7,035,615 B2
(45) Date of Patent: Apr. 25, 2006

(54) MIXER CIRCUIT HAVING IMPROVED EVEN ORDER NOISE, DC OFFSET, AND LINEARITY CHARACTERISTIC

(75) Inventors: Youngjin Kim, Seongnam-si (KR); Bonkee Kim, Yongin-si (KR); Kwyro Lee, Daejon (KR); Sunguk Kim, Seoul (KR); Yongseok Kim, Seoul (KR)

(73) Assignee: Integrant Technologies Inc., Seongnam-si (KR)

( * ) Notice: Subject to any disclaimer, the term of this patent is extended or adjusted under 35 U.S.C. 154(b) by 416 days.

(21) Appl. No.: 10/257,920

(22) PCT Filed: Feb. 20, 2002

(86) PCT No.: PCT/KR02/00269

§ 371 (c)(1),
(2), (4) Date: Oct. 18, 2002

(87) PCT Pub. No.: WO02/075917

PCT Pub. Date: Sep. 26, 2002

(65) Prior Publication Data

US 2003/0109238 A1 Jun. 12, 2003

(30) Foreign Application Priority Data

Feb. 20, 2001 (KR) .............................. 2001/8386
Dec. 28, 2001 (KR) .............................. 2001/86495

(51) Int. Cl.
*H04B 1/10* (2006.01)
*H04B 15/06* (2006.01)

(52) U.S. Cl. .................. 455/317; 455/324; 455/333

(58) Field of Classification Search ................ 455/313, 455/317, 318, 323, 324, 326, 333; 327/113, 327/356

See application file for complete search history.

(56) References Cited

U.S. PATENT DOCUMENTS

| 5,752,181 A | 5/1998 | Vice |
| 5,884,154 A * | 3/1999 | Sano et al. .................. 455/321 |
| 6,073,001 A | 6/2000 | Sokoler |
| 6,680,650 B1 * | 1/2004 | Gupta ......................... 330/277 |

FOREIGN PATENT DOCUMENTS

| EP | 0 305 602 A1 | 3/1989 |
| EP | 0 877 476 A1 | 11/1998 |

OTHER PUBLICATIONS

Takafumi Yamaji, Hiroshi Tanimoto "A 2GHz Balanced Harmonic Mixer for Direct-Conversion Receivers" Custom Integrated Circuits Conference, 1997 IEEE, Research and Development Center, Toshiba Corporation Kawasaki, Japan.
Zhiheng Chen and Jack Lau Radio Frequency Integrated Circuits(RFIC) Syposium, 1998 IEEE p. 342, col 2, line 5—line 9 & figure 4.
Popa, C,; Mitrea, O. Image and Signal Processing and Analysis, 2001. ISPA 2001 Proceedings of the $2^{nd}$ International Symposium on Published:2001 line 4—line 7 & p. 513.

* cited by examiner

*Primary Examiner*—Nguyen T. Vo
(74) *Attorney, Agent, or Firm*—Shinjyu Global IP Counselors, LLP

(57) ABSTRACT

The present invention relates to improvement of even order distortion noise, DC offset, and non-linearity of mixer circuits. According to the present invention, a mixer circuit is provided, which comprises a splitter for splitting an input signal to the first and second signal having phase difference of 180 degree, a local oscillator, first mixer for mixing the first signal with the local oscillation signal, second mixer for mixing the second signal with the local oscillation signal, and subtractor for subtracting the output of the second mixer from the output of the first mixer.

20 Claims, 14 Drawing Sheets

[Fig. 1]
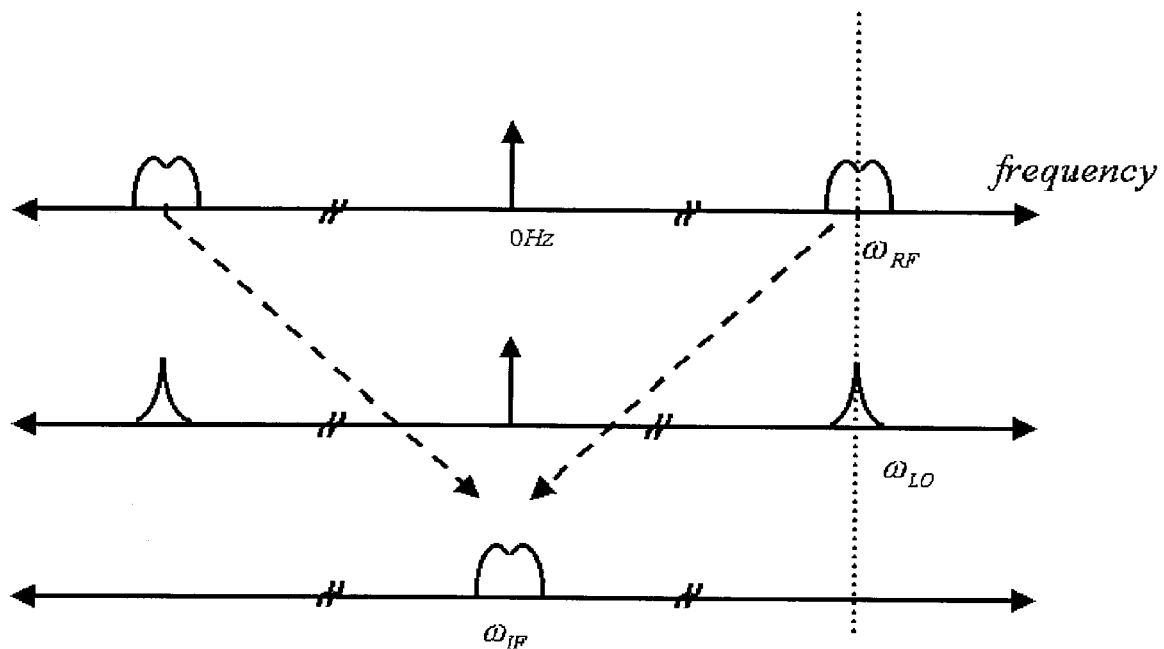
[Fig. 2]
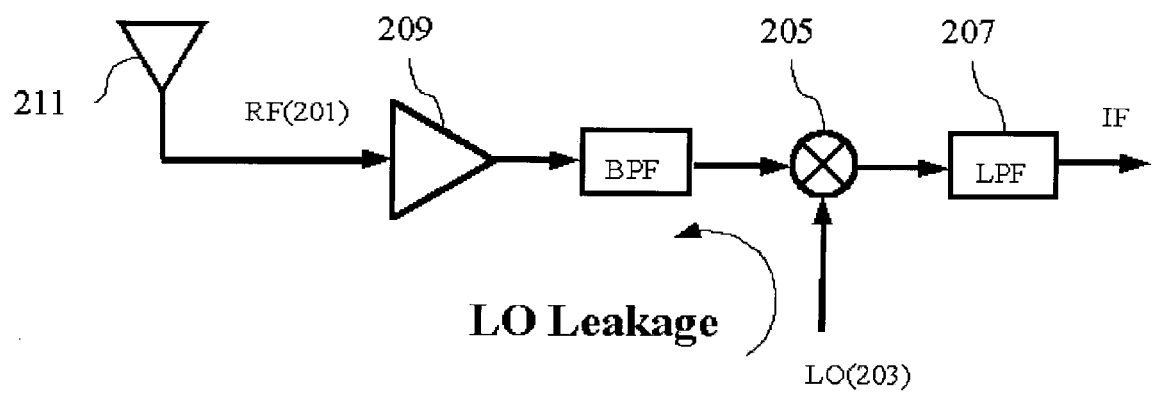

[Fig. 3]
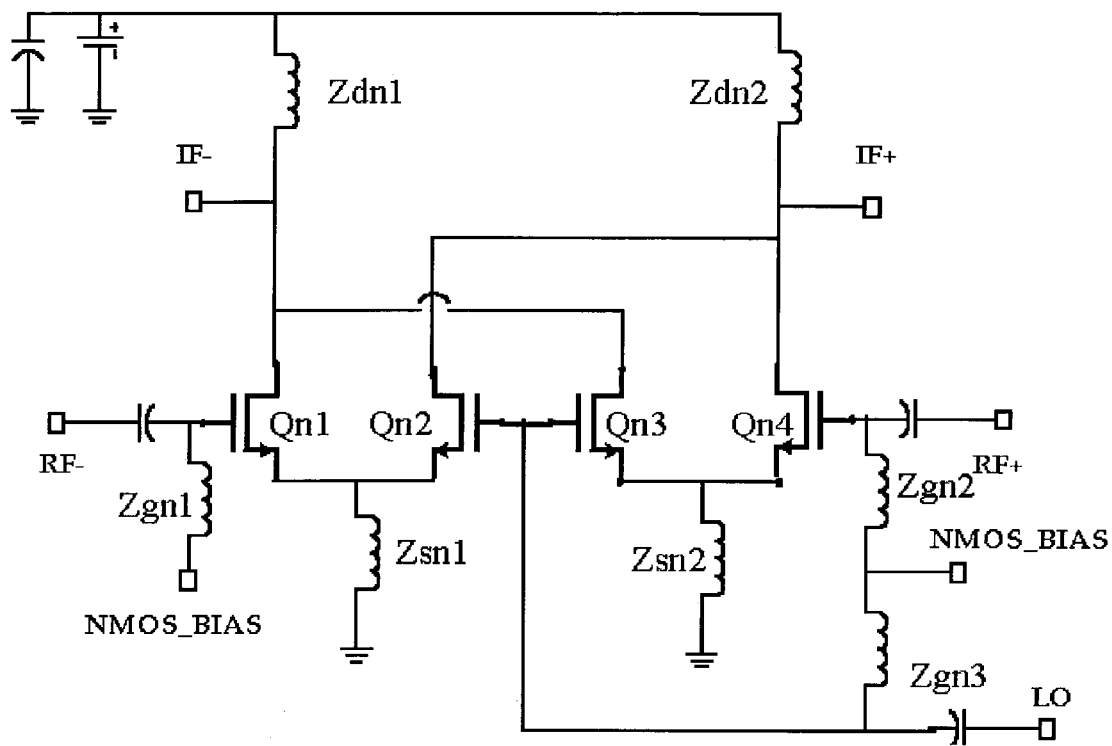
[Fig. 4]
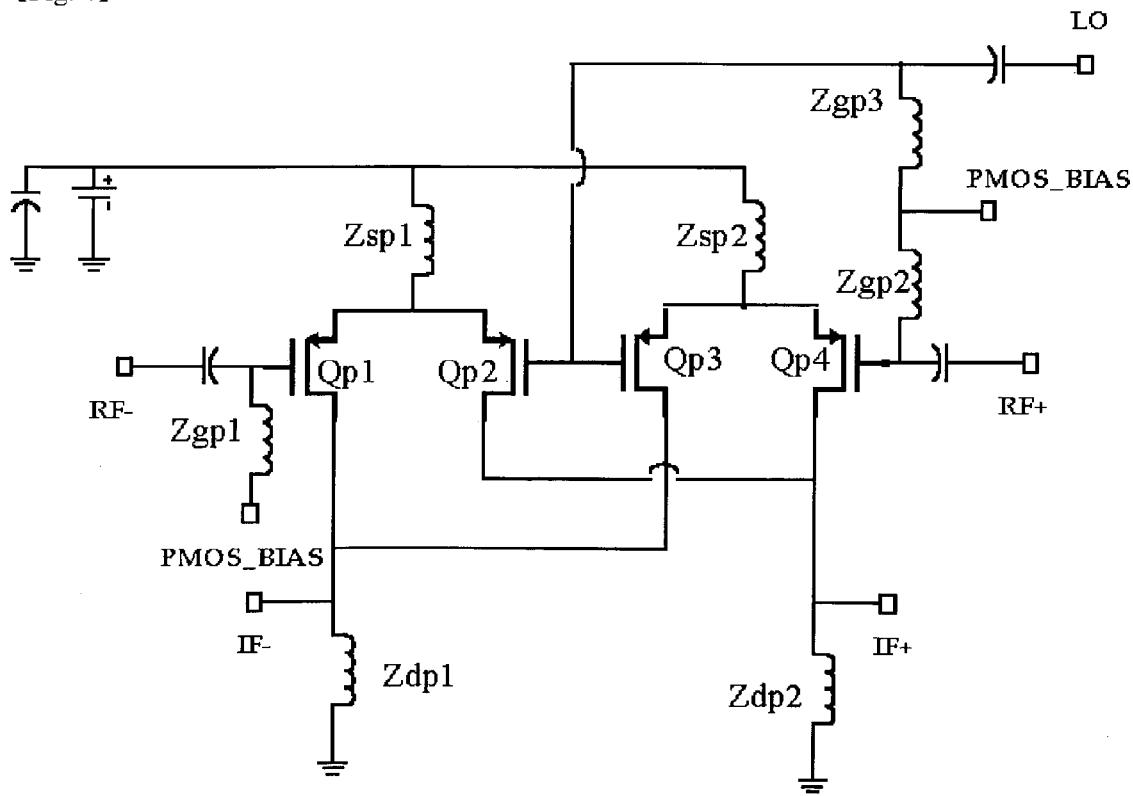

[Fig. 5]
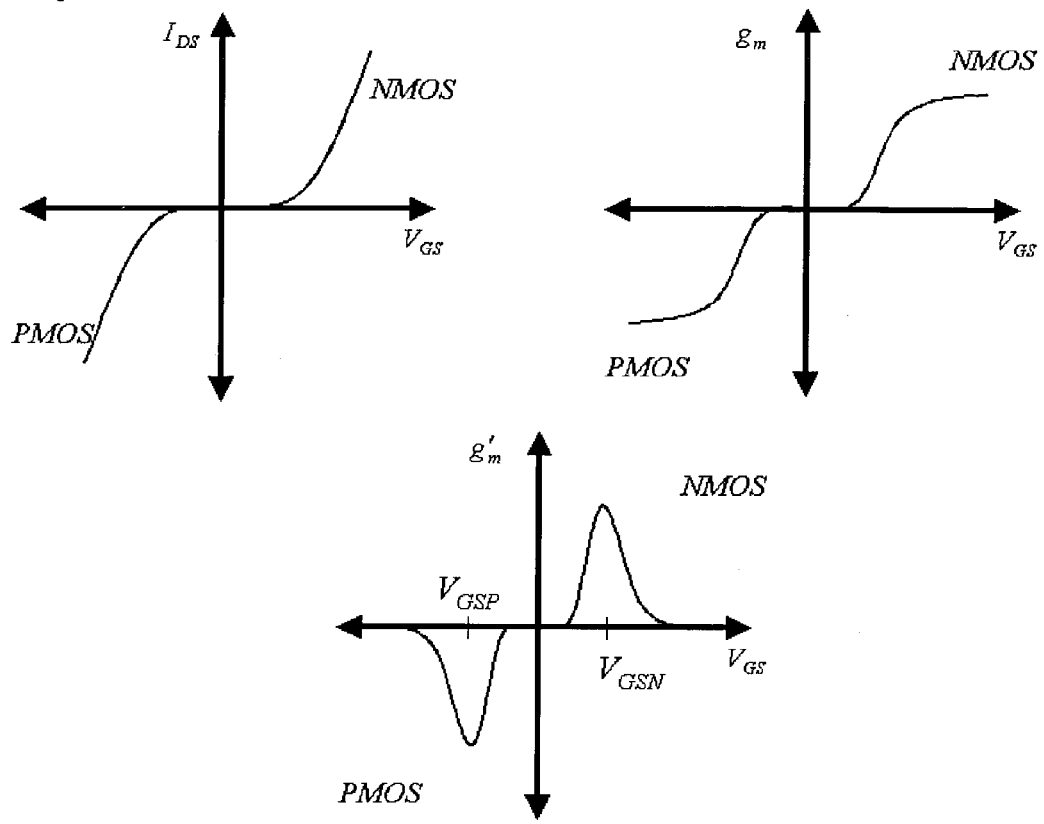
[Fig. 6]
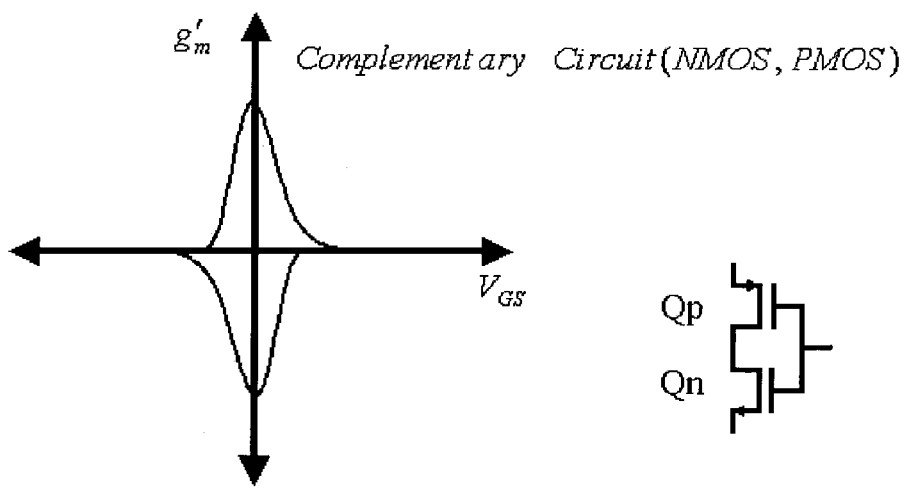

[Fig. 7]
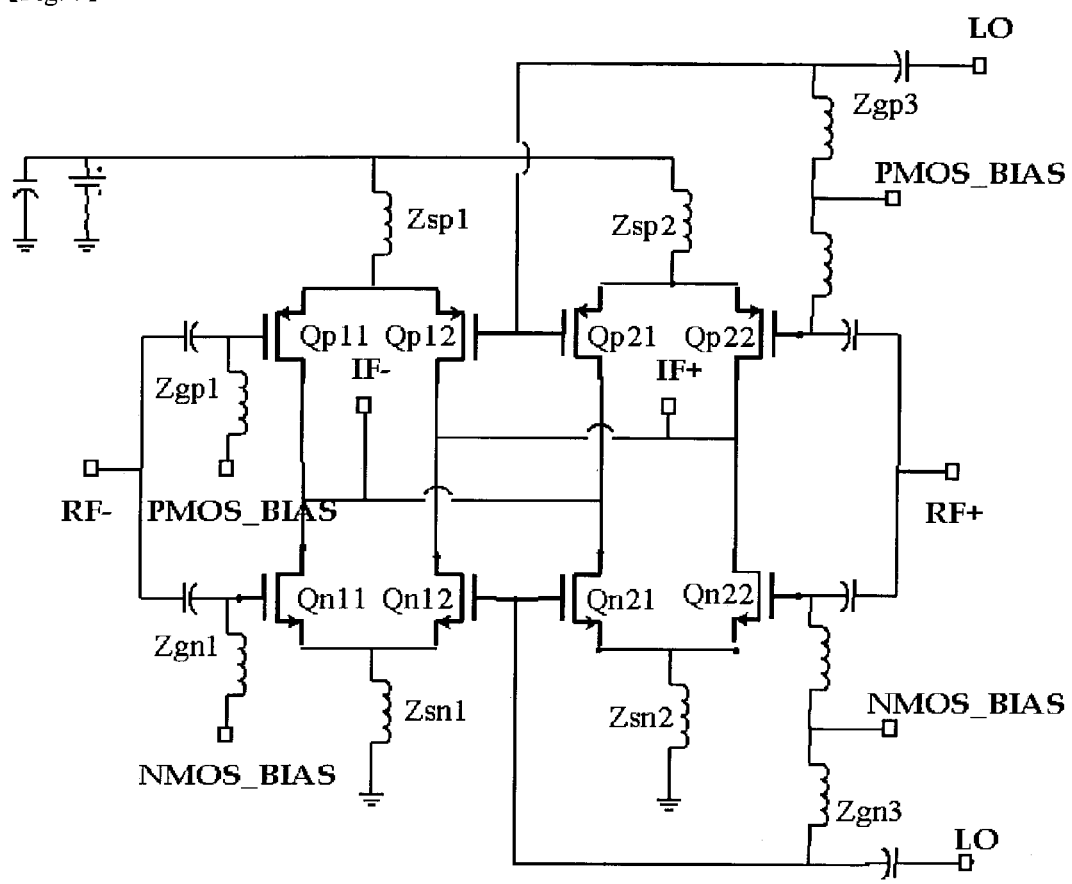

[Fig. 8]
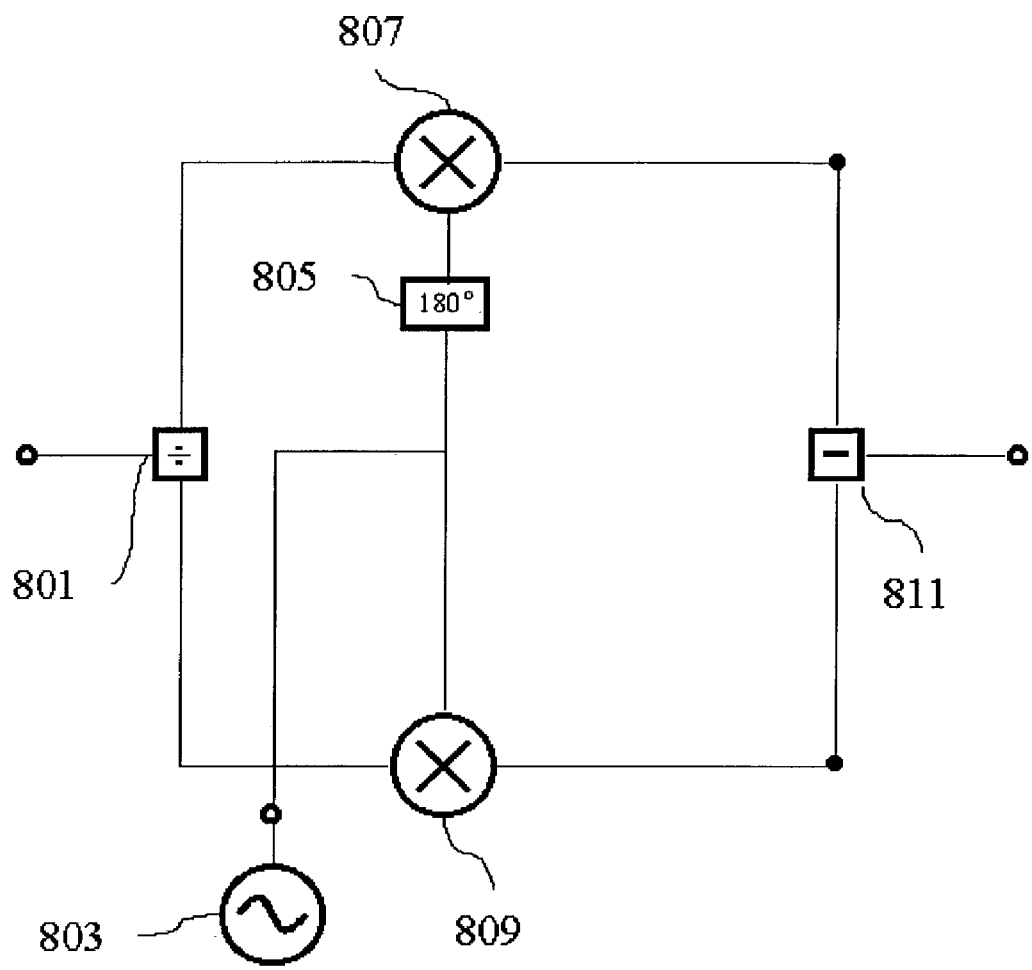

[Fig. 9]
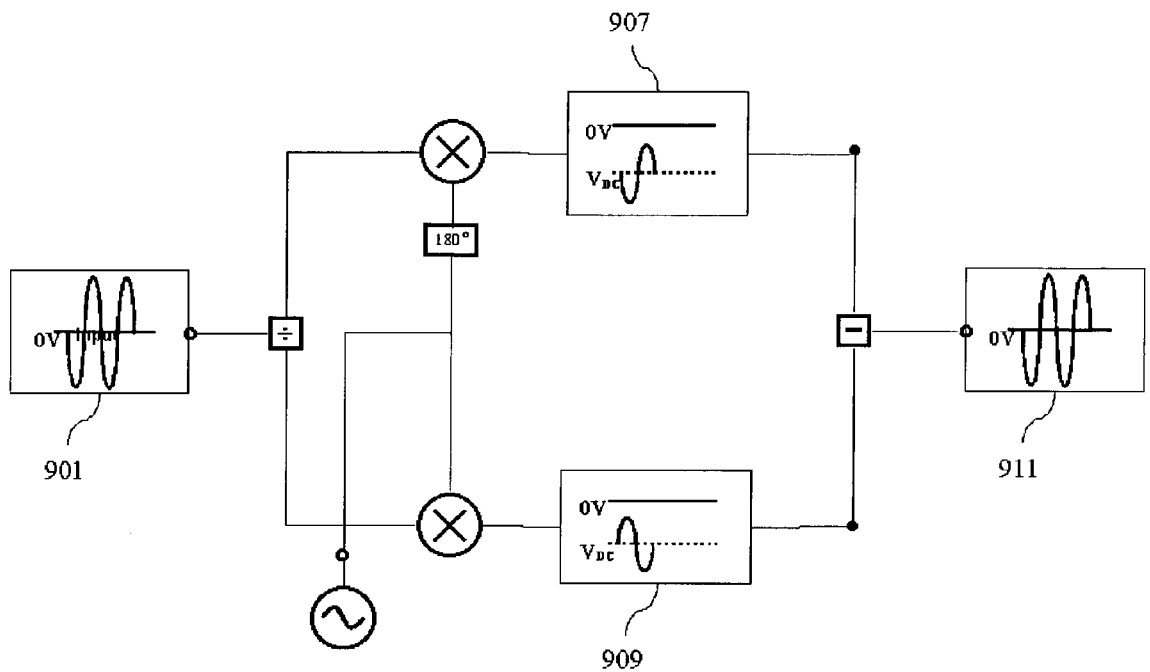
[Fig. 10]
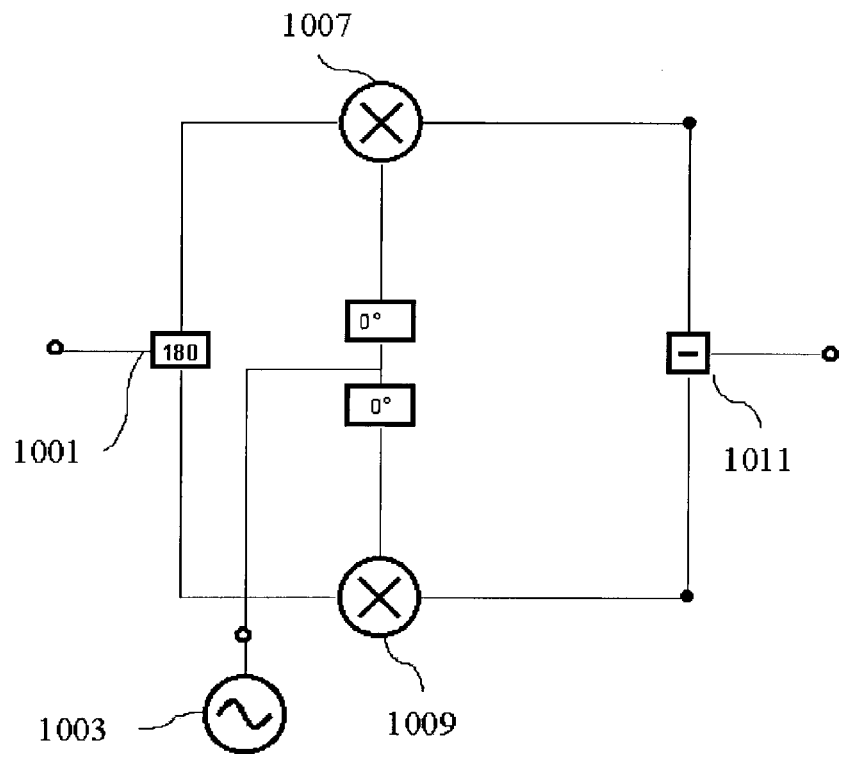

[Fig. 11]
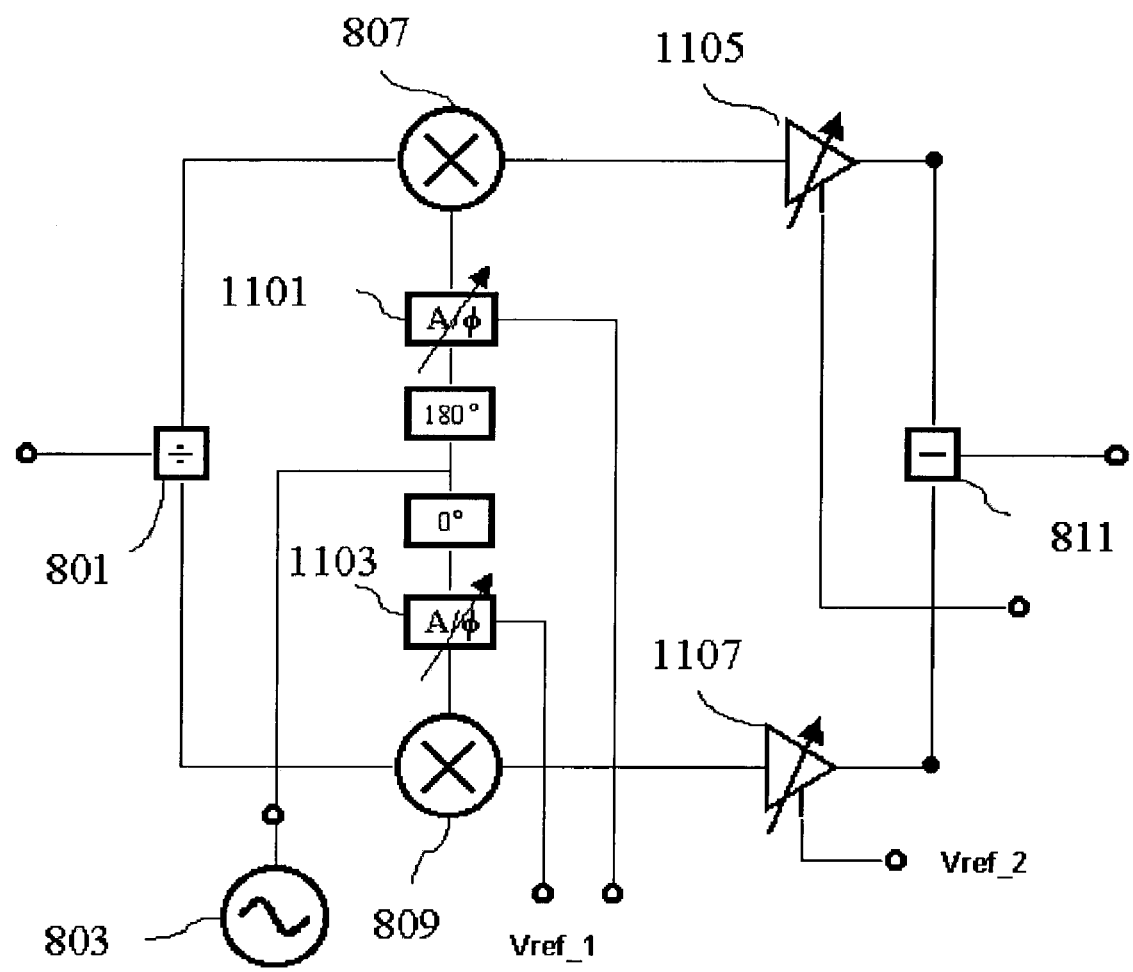

[Fig. 12]
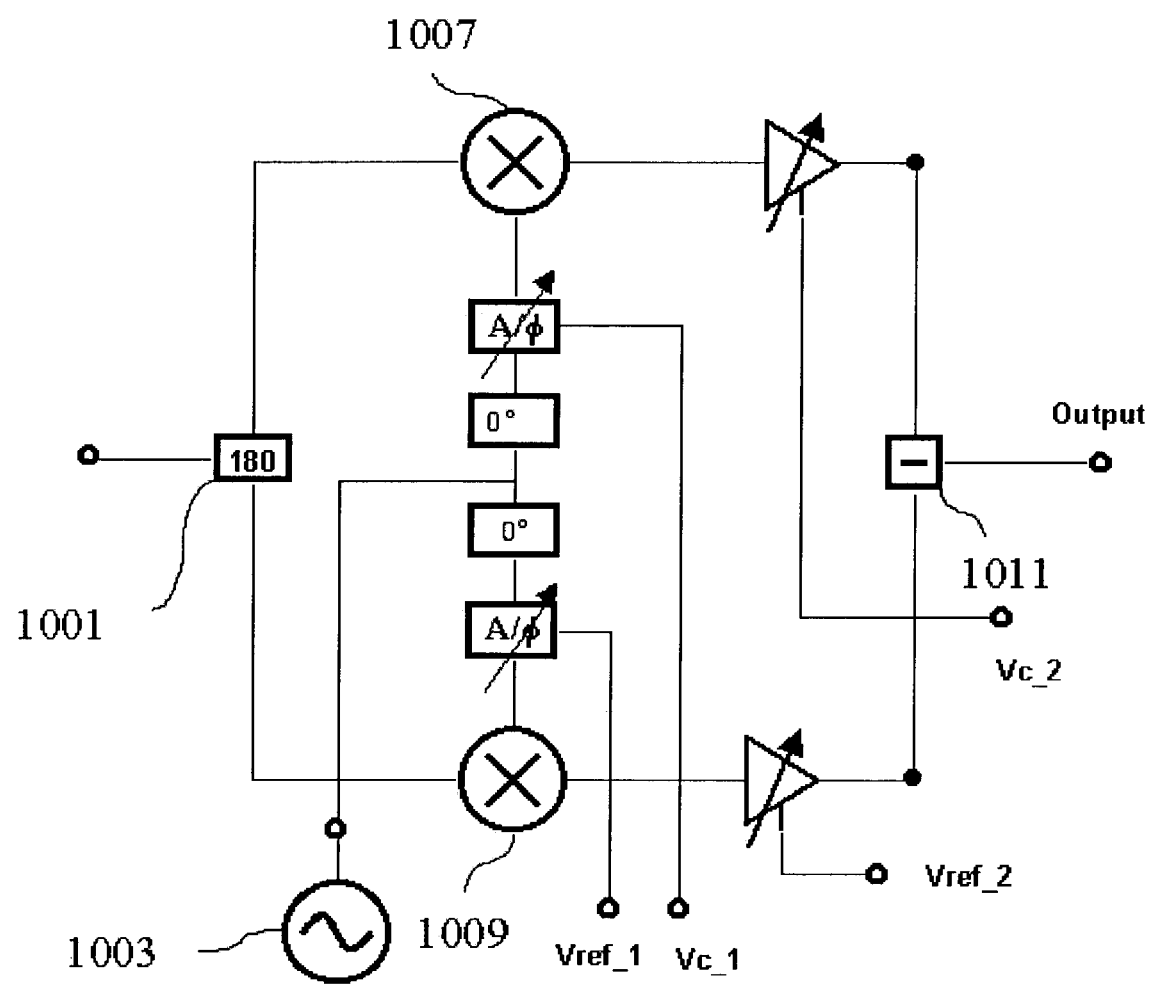

[Fig. 13]
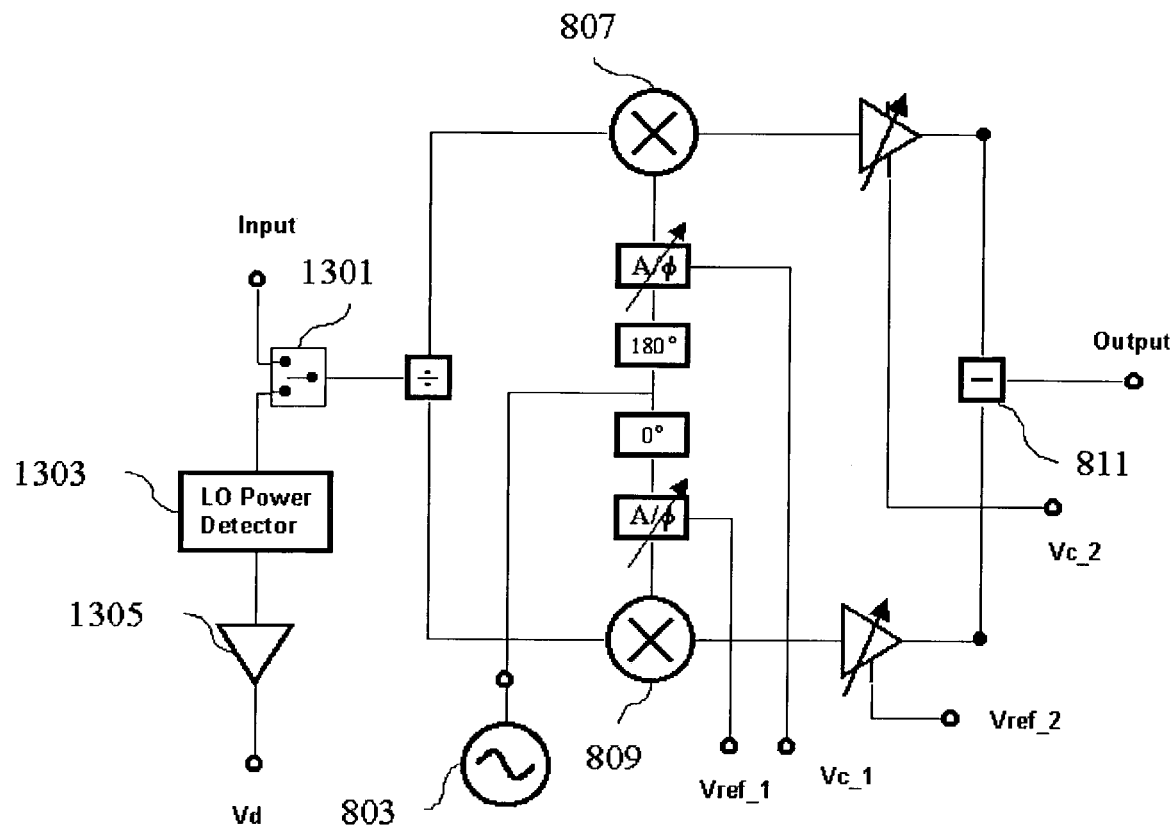
[Fig. 14]
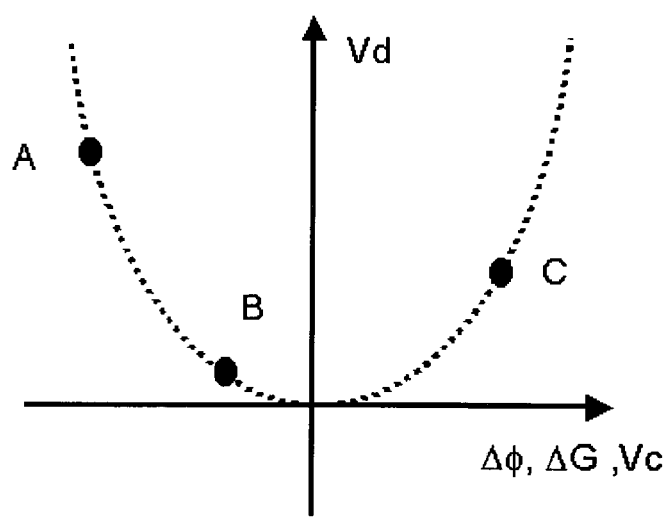

[Fig. 15]
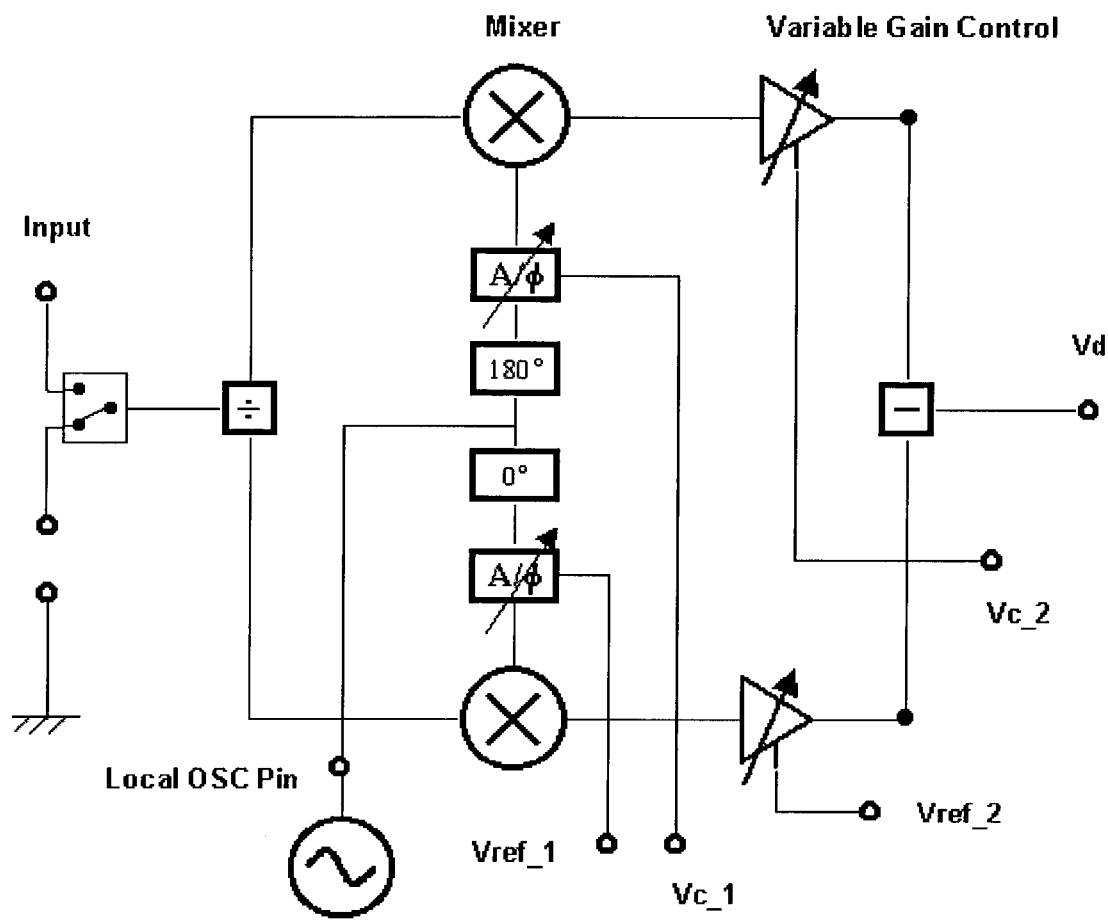

[Fig. 16]
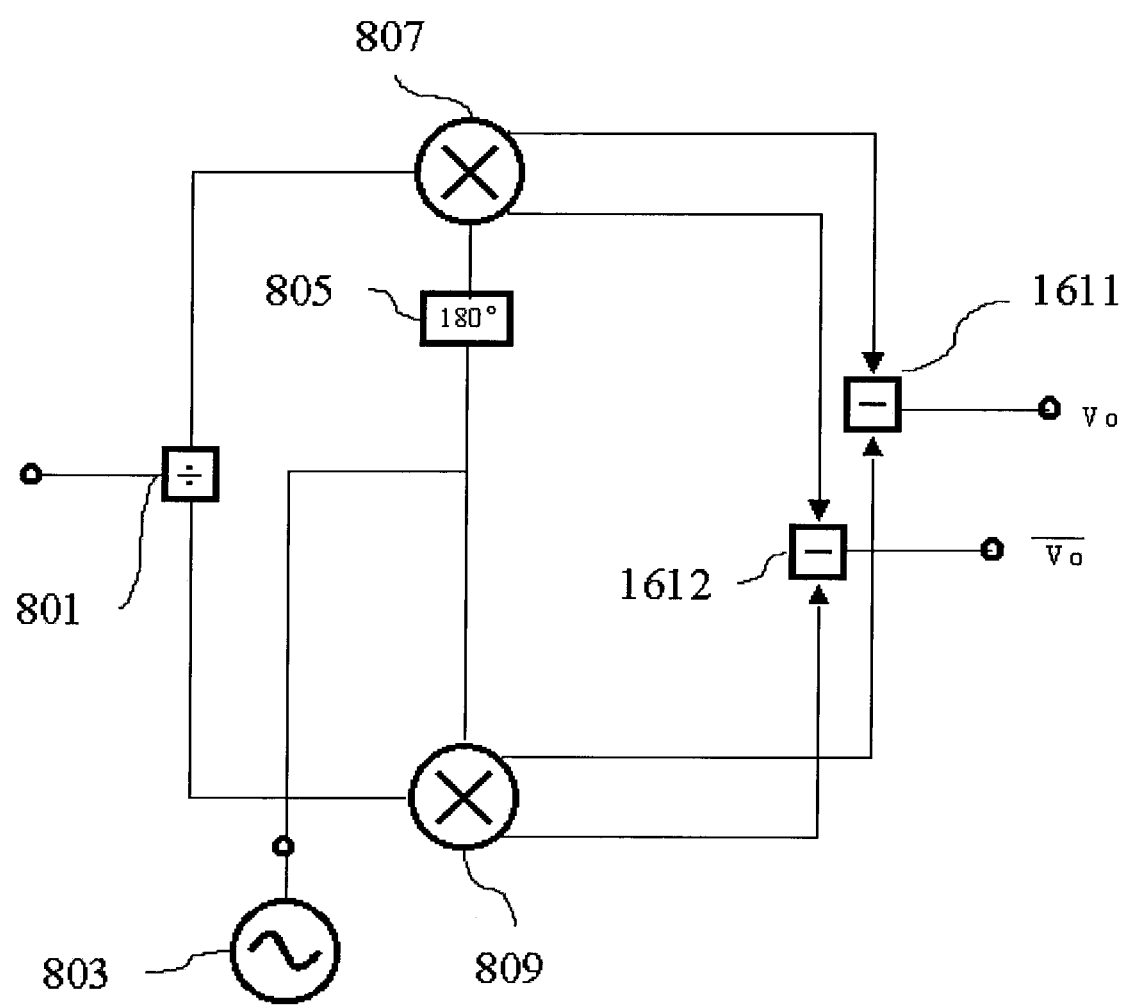

[Fig. 17]
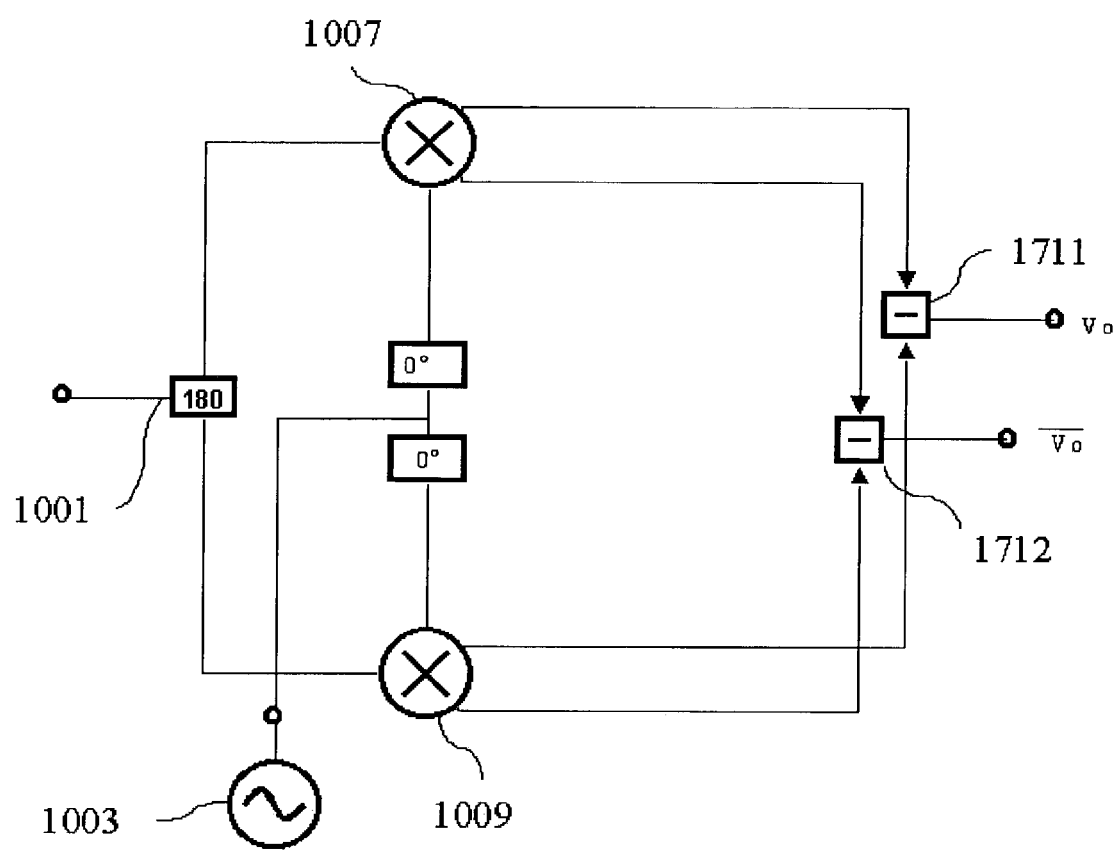

[Fig. 18]
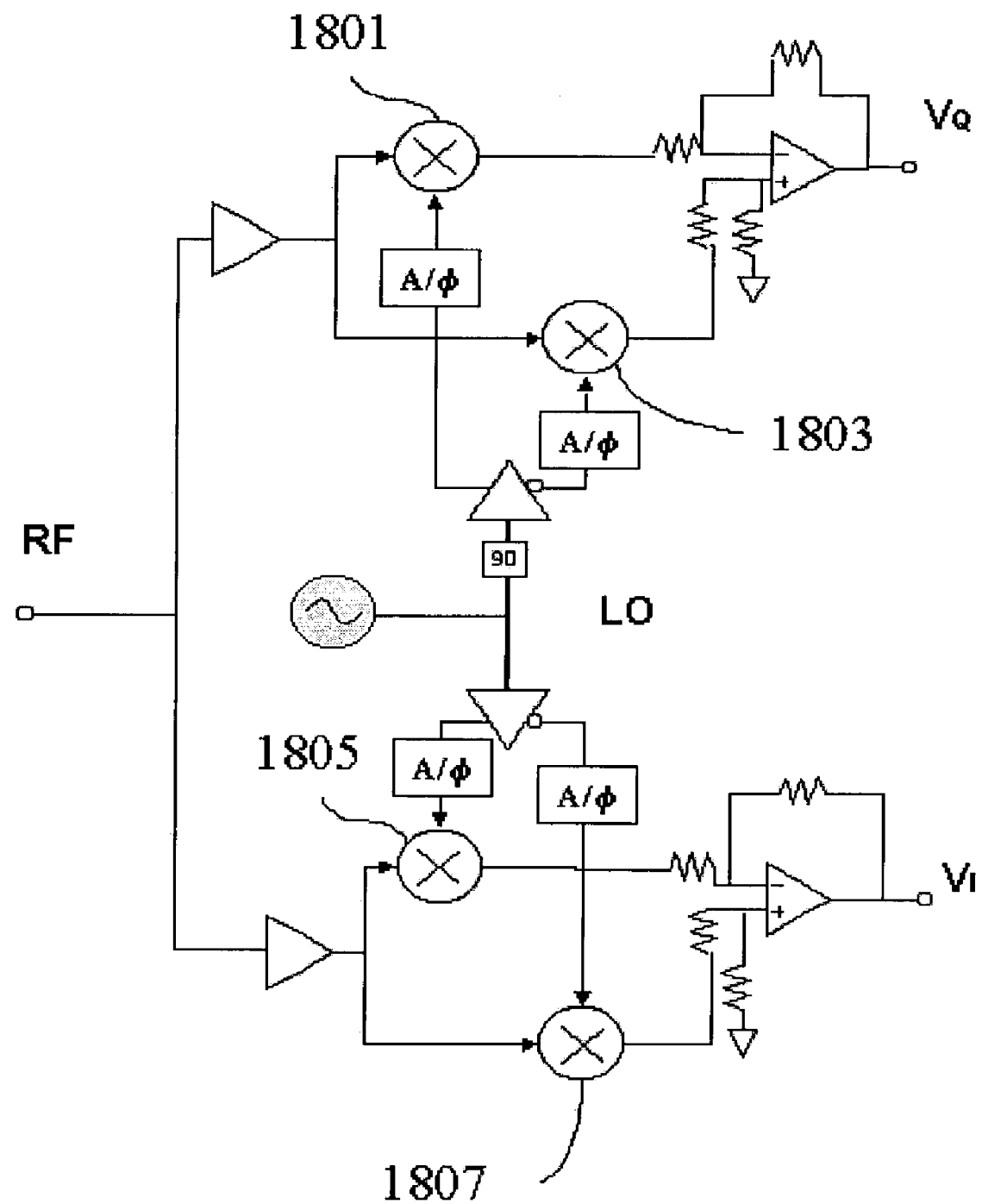

[Fig. 19]
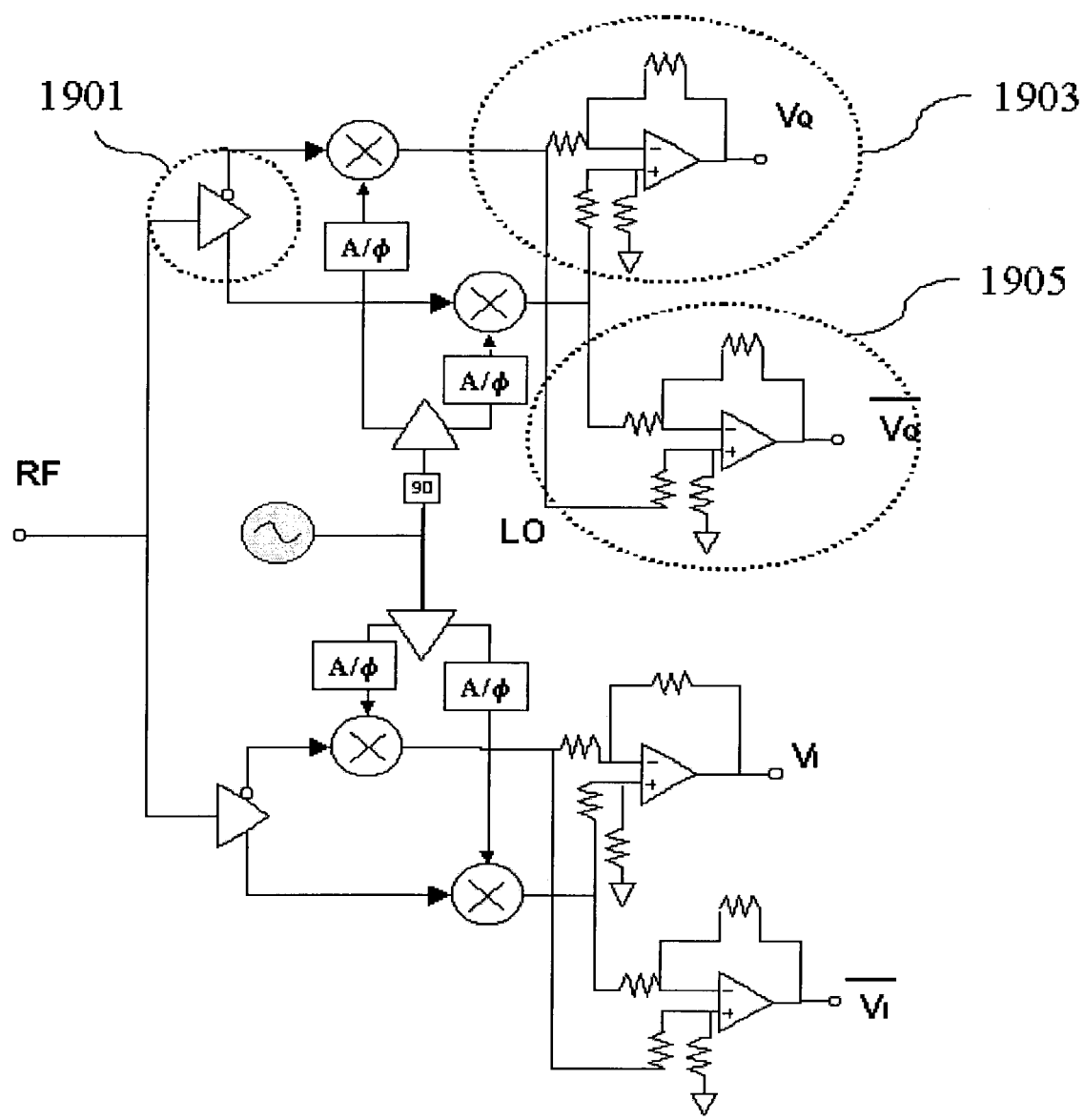

MIXER CIRCUIT HAVING IMPROVED EVEN ORDER NOISE, DC OFFSET, AND LINEARITY CHARACTERISTIC

TECHNICAL FIELD

The present invention relates to a mixer circuit, more specifically to an improvement of even order noise, DC offset, and linearity characteristics of the mixer circuit applicable to the direct conversion etc.

BACKGROUND OF THE INVENTION

Recently, it is required that the user terminal is to become smaller, cheaper and consume less power according to the wide use of the portable wireless telephone. Thus, direct conversion receiver is broadly used. If direct conversion receiver is used, the channel filter of bandwidth pass filter (BPF) which is necessary to the superheterodine receiver is not required since there is no image frequency component. Instead of that, low pass filter (LPF) is used as the channel filter. Therefore, the integrated circuit fabrication process can be made simple.

Direct conversion receiver basically transforms the input radio frequency signal to the baseband frequency signal directly. This corresponds to the case that the middle frequency is 0 Hz for the superheterodine receiver. Therefore, local oscillator signal having nearly the same frequency as the input frequency is generated and mixed with the input frequency to directly transform the input radio frequency signal to the baseband frequency signal. FIG. 1 shows the input signal whose carrier frequency is $\omega_{RF}$, LO signal whose frequency is $\omega_{LO}$, and the baseband signal generated by mixing the above two signals in the frequency domain. FIG. 2 is a circuit diagram illustrating the mixer 205 for mixing the input signal 201 and LO signal 203 and related circuits.

As shown in FIG. 1, the middle frequency $\omega_{IF}$ signal having zero (0) Hz frequency is generated by mixing the LO signal having the same frequency $\omega_{LO}$ as the carrier frequency $\omega_{RF}$ of the RF modification signal using a mixer. The middle frequency signal whose frequency is 0 Hz generated by mixing the carrier frequency and LO signal includes the baseband frequency signal, LO frequency $\omega_{LO}$ signal, carrier frequency $\omega_{IF}$ signal, the signal whose frequency $\omega_{LO}+\omega_{IF}$ is the sum of the LO frequency and the carrier frequency, and the signal whose frequency $|\omega_{LO}-\omega_{IF}|$ is the difference between the LO frequency and the carrier frequency components. It is possible to extract the information signal and the signal whose frequency $|\omega_{LO}-\omega_{IF}|$ is the difference between the LO frequency and the carrier frequency component by cutting off the signals except the baseband frequency signal among those components using low pass filter as shown in FIG. 2.

This direct conversion receiver still has some shortcomings as listed below.

First, the direct conversion receiver has the problem of DC offset voltage due to the mixing of the signals having the same frequency, The reason of the generation of the DC offset is as follows. As shown in FIG. 2, a part of the LO signal is leaked through the radio frequency signal input terminal of the mixer 205 due to the characteristic of the hardware. The leaked LO signal is reflected from the output port of the radio frequency signal amplifier 209 and the antenna 211. The reflected LO signal is mixed with the LO signal in the mixer and appears as the DC component in the output signal. This is called as dynamic DC offset. The amount of the dynamic DC offset depends largely on the reflective ratio at the radio frequency signal amplifier 209 and the antenna 211. The reflective ratio is variable according to the amplifying ratio of the amplifier 209, and therefore, the amount of dynamic DC offset is variable to time.

Another reason for DC offset is non-symmetric characteristic between circuits contributes to the signals of positive phase and the reverse phase in the case of so-called balanced mixer which obtains the signals of positive and reverse phases from the signal component whose frequency $|\omega_{LO}-\omega_{IF}|$ is the difference between the LO frequency and the carrier frequency component. Then, the signals of positive phase and the reverse phase from the signal component whose frequency $|\omega_{LO}-\omega_{IF}|$ is the difference between the LO frequency and the carrier frequency component are generated asymmetrically and DC offset is brought about. This is called as static DC offset.

Those DC offset remains in the output signal as the non-preferable component, and becomes a reason of deterioration of the characteristics of the direct conversion receiver using mixer. Therefore, the DC offset voltage existing in the mixer should be removed.

Second, the direct conversion receiver has a problem of second order intermodulation (IMD2) component. Most mixer circuits are implemented by the active elements. The active elements show non-linear characteristic especially in the case that the radio frequency signal is inputted.

This non-linear characteristic can be approximated by the power series. The most important component of the even order component among the components which is approximated by the power series is the second order component, and the even order component can be approximated as the second order component.

However, the non-linear characteristic of the mixer circuit as described above is known as the main reason for deterioration of the performance of the whole circuit of the direct receiver.

SUMMARY OF THE INVENTION

The object of the present invention is to provide a mixer circuit whose DC offset is removed.

Another object of the present invention is to provide a mixer circuit whose non-linear characteristic due to the non-linear characteristic, especially the even order component is improved as well as removing the DC offset.

Another object of the present invention is to provide a mixer circuit whose leakage of the local signal to the input terminal is reduced.

Another object of the present invention is to provide a mixer circuit whose gain for the DC signal at the output terminal is substantially zero (0).

Another object of the present invention is to provide a mixer circuit whose DC offset due to the phase mismatching and the gain mismatching of the mixer circuit is substantially zero (0).

According to an aspect of the present invention, a mixer circuit comprising a first circuit including a first active element and a second element; and a second circuit including a third active element and a fourth element; and wherein each of the first through the fourth active elements has a first terminal, a second terminal, and a third terminal; the amount and the direction of the current flowing from the second terminal to the third terminal are changed based on the voltage applied between the first terminal and the second terminal is provided. The second terminals of the first active element and the second element are connected to each other and connected to a second power supply via a first bias and impedance part of the second terminal side, and the second terminals of the third active element and the fourth element are connected to each other and connected to a second power supply via a second bias and impedance part of the second terminal side, the first terminals of the first active element and the fourth element are connected to the first input terminal and the second input terminal, respectively, and the first terminals of the second active element and the third element are connected to each other and connected to the third input terminal, the first input terminals of the first through fourth active elements are connected to a first voltage via the first bias and impedance parts, respectively, to maintain a prescribed operational bias voltage, and the connection point of the third terminal of the first active element and the third element is connected to a first power supply via a first output terminal and a bias and impedance part of the first output side, and the connection point of the third terminal of the second active element and the fourth element is connected to a first power supply via a second output terminal and a bias and impedance part of the second output side.

According to another aspect of the present invention, a mixer circuit comprising a first circuit including a first active element and a second element; and a second circuit including a third active element and a fourth element; and wherein each of the first through the fourth active elements has a first terminal, a second terminal, and a third terminal; the amount and the direction of the current flowing from the second terminal to the third terminal are changed based on the voltage applied between the first terminal and the second terminal is provided. The second terminals of the first active element and the second element are connected to each other and connected to a first power supply via a first bias and impedance part of the first source terminal side, and the second terminals of the third active element and the fourth element are connected to each other and connected to said first power supply via a second bias and impedance part of the second source side, the first terminals of the first active element and the fourth element are connected to the first radio frequency input terminal and the second radio frequency input terminal, respectively, and the first terminals of the second active element and the third element are connected to each other and connected to the local oscillator (LO) signal input terminal, the first input terminals of the first through fourth active elements are connected to a first voltage via the first bias and impedance parts, respectively, to maintain a prescribed operational bias voltage, and the connection point of the third terminal of the first active element and the third element is connected to a second power supply via a first output terminal and a bias and impedance part of the first output side, and the connection point of the third terminal of the second active element and the fourth element is connected to said second power supply via a second output terminal and a bias and impedance part of the second output side.

According to another aspect of the present invention, a mixer circuit comprising a first type circuit part comprising a first circuit including a first active element and a second element and a second circuit including a third active element and a fourth element, each of the first through the fourth active elements having a first terminal, a second terminal, and a third terminal, and the amount and the direction of the current flowing from the second terminal to the third terminal being changed based on the voltage applied between the first terminal and the second terminal; and a second type circuit part comprising a first circuit including a first active element and a second element of a second type complementary to said first type and a second circuit including a third active element and a fourth element of a second type is provided. The second terminals of the first active element and the second element of the first type are connected to each other and connected to a second power supply via a first bias and impedance part of the second terminal side of the first type, the second terminals of the third active element and the fourth element of the first type are connected to each other and connected to a second power supply via a second bias and impedance part of the second terminal side of the first type; the second terminals of the first active element and the second element of the second type are connected to each other and connected to a first power supply via a first bias and impedance part of the second terminal side of the second type, and the second terminals of the third active element and the fourth element of the second type are connected to each other and connected to a second power supply via a second bias and impedance part of the second terminal side of the second type, the connection point of the first terminals of the first active elements of said first type and second type and the connection point of the first terminals of the fourth elements of said first type and second type are connected to the first radio frequency input terminal and the second radio frequency input terminal, respectively, and the first terminals of the second active element and the third element of said first type and said second type are connected to each other and connected to the local oscillator (LO) signal input terminal, the first terminals of the first active element through the fourth element of said first type and second type are connected to the first voltage via a first bias and impedance part through a fourth bias and impedance part of first type first input terminal side and a first bias and impedance part through a fourth bias and impedance part of second type first input terminal side, respectively, to maintain a prescribed operational bias voltage, and the connection point of the third terminals of the first active element and the third element of said first type and second type is connected to a first power supply via a first output terminal and a bias and impedance part of the first output side, and the connection point of the third terminals of the second active element and the fourth element of said first type and second type is connected to a first power supply via a second output terminal and a bias and impedance part of the second output side.

According to another aspect of the present invention, a mixer circuit comprising a separator separating input signal from input terminal to a first signal and a second signal having about 180 degrees of phase difference from each other; a local oscillator generating local frequency signal; a first mixer mixing said first signal and said local frequency signal; a second mixer mixing said second signal and said local frequency signal; and a subtractor subtracting output signal of said second mixer from output signal of said first mixer is provided.

According to another aspect of the present invention, a mixer circuit comprising a separator separating input signal from input terminal to a first signal and a second signal having the same phase; a local oscillator generating local frequency signal; a phase transformer transforming said local frequency signal about 180 degrees phase; a first phase compensation means for transforming the phase of the local frequency signal LO which is 180 degrees phase transformed by a prescribed phase value; a second phase compensation means for transforming the phase of the local frequency signal LO by a prescribed phase value; a first mixer mixing said first signal and the signal whose phase is transformed by said first phase compensation means; a second mixer mixing said second signal and the signal whose phase is transformed by said second phase compensation means; a subtractor subtracting output signal of said second mixer from output signal of said first mixer; and means for changing the phase value transformed by the one of said first phase compensation means and said second phase compensation means while the phase value transformed by the other of said first phase compensation means and said second phase compensation means is fixed is provided.

According to another aspect of the present invention, a mixer circuit comprising a separator separating input signal from input terminal to a first signal and a second signal having the same phase; a local oscillator generating local frequency signal; a phase transformer transforming said local frequency signal about 180 degrees phase; a first mixer mixing said first signal and the signal whose phase is transformed by 180 degrees; a second mixer mixing said second signal and said local frequency signal LO; a first gain compensation means for adding a prescribed gain to the output signal of said first mixer; a second gain compensation means for adding a prescribed gain to the output signal of said second mixer; a subtractor subtracting the output signal of said second gain compensation means from the output signal of said first gain compensation means; and means for changing the gain value added by the one of said first gain compensation means and said second gain compensation means while the gain value added by the other of said first gain compensation means and said second gain compensation means is fixed is provided.

BRIEF DESCRIPTION OF THE DRAWINGS

FIG. 1 shows the input signal whose carrier frequency is $\omega_{RF}$, LO signal whose frequency is $\omega_{LO}$, and the baseband signal generated by mixing the above two signals in the frequency domain.

FIG. 2 is a circuit diagram illustrating the mixer 205 for mixing the input signal 201 and LO signal 203 and related circuits.

FIG. 3 is a circuit diagram illustrating the mixer circuit whose DC offset is cut off according to the present invention.

FIG. 4 is a circuit diagram showing the complementary circuit with the embodiment shown in FIG. 3 using P type MOSFETs whose characteristics are complementary to N type MOSFET.

FIG. 5 is a graph illustrating the drain current $I_{DS}$, transconductance gm, and first differential equation gm' of the transconductance to the voltage Vgs between gate and source.

FIG. 6 shows the circuit composed as the drains of N-type MOSFET and P-type MOSFET are connected to each other and to be biased in the region in which the having the maximum or the minimum value, and the graph illustrating the values of the first differential equations of transconductances of two elements of the same circuit.

FIG. 7 is a circuit diagram showing a mixer circuit whose linearity is improved using the active elements which are complementary to each other according to the preferred embodiment of the present invention.

FIG. 8 is a circuit diagram illustrating the first embodiment of the mixer circuit in which the DC offset is cut off according to the present invention.

FIG. 9 is to explain the operation of the circuit shown in FIG. 8.

FIG. 10 is a circuit diagram illustrating the second embodiment of the mixer circuit in which the DC offset is cut off according to the present invention.

FIG. 11 is a block diagram illustrating another embodiment of the mixer circuit according to the present invention.

FIG. 12 is the circuit having means for measuring and compensating the phase mismatching and the gain mismatching for the second embodiment shown in FIG. 11.

FIG. 13 shows another embodiment of the mixer circuit having means for phase compensation and gain compensation according to the present invention.

FIG. 14 is a graph showing an example of the change of the detected power Vd according to the phase mismatching $\Delta\phi$, gain mismatching $\Delta G$, or control voltage Vc.

FIG. 15 shows an embodiment in which the mismatching is compensated by directly measuring the output voltage and power.

FIG. 16 is an embodiment of the mixer circuit in which the first embodiment of the present invention designed to output differential signals.

FIG. 17 is an embodiment of the mixer circuit in which the second embodiment of the present invention designed to output differential signals.

FIG. 18 shows the embodiment of the IQ mixer circuit made of the mixer circuits according to the present invention.

FIG. 19 shows the embodiment of the IQ mixer circuit made of the embodiment having differential output as a unit mixer among the mixer circuits according to the present invention.

DETAILED DESCRIPTION

First Embodiment of the Mixer Circuit

FIG. 3 is a circuit diagram illustrating an embodiment of the mixer circuit in which DC offset is cut off according to the present invention.

The mixer circuit according to the present invention utilizes four (4) active elements Qn1, Qn2, Qn3 and Qn4. Each Qn of the active elements has a gate gn, source sn and drain dn. The active element Qn has a characteristic that the direction and the quantity of current flowing from the source sn to the drain dn or vice versa are determined according to the polarity and the amount of the voltage applied to the gate gn and the source sn. Active elements having such characteristic includes bipolar junction transistor (BJT), junction field effect transistor (JFET), metal oxide semiconductor field effect transistor (MOSFET), and metal semiconductor field effect transistor (MESFET).

Some active elements have body terminal bn besides the gate gn, source sn, and drain dn. Such active elements have a characteristic that the direction and the quantity of current flowing from the source sn to the drain dn or vice versa are determined according to the polarity and the amount of the voltage applied to the gate gn and the body dn. Active elements having such characteristic includes metal oxide semiconductor field effect transistor (MOSFET).

It will be described using MOSFET as an example. However, the spirit of the present invention can be applied to all active elements which can be used as an amplifier as well as the MOSFET. Therefore, the idea and the scope of the present invention is not confined to the MOSFET though the description is concentrated to the MOSFET in this specification.

As shown in FIG. 3, an amplifier circuit whose linearity is improved according to the present invention comprises a first mixer circuit including a first active element Qn1 and a second active element Qn2, and a second mixer circuit including a third active element Qn3 and a fourth active element Qn4. FIG. 3 shows that all of the active elements Qn1, Qn2, Qn3 and Qn4 are N-type MOSFETs, and the description will be concentrated to the N-type MOSFET. However, it is apparent to those skilled in the art that the complementary circuit to the circuit shown in FIG. 3 may be composed using the complementary elements of N-type MOSFET, and this will be mentioned later.

The first mixer circuit and the second mixer circuit have constitutions of source-coupled pair. That is, for the first mixer circuit, the sources of the first active elements Qn1 and the second active element Qn2 are connected to each other and connected to the first power supply via the prescribed bias and impedance Zsn1 of source side. For the second mixer circuit, the sources of the third active elements Qn3 and the fourth active element Qn4 are connected to each other and connected to the second power supply via the prescribed bias and impedance Zsn2 of source side. According to the preferred embodiment of the present invention, they may be earthed instead of connecting to the second power supply.

Gates of the first active element Qn1 and the second active element Qn2 are connected to the first radio frequency input terminal RF− and the second radio frequency input terminal RF+, respectively. The first power supply is applied to the gates of the first active element and the fourth active element to maintain driving bias voltage via biases and impedances Zgn1 and Zgn2 of gate sides respectively.

It is preferable that the radio frequency signals having reverse phases are applied to the first radio frequency input terminal RF− and the second radio frequency input terminal RF+ for the embodiment shown in FIG. 3 to act as the mixer circuit. The radio frequency signals inputted to the first radio frequency input terminal RF− and the second radio frequency input terminal RF+ are the signals in which the information signals are modified by the carrier wave having prescribed radio frequency. In this specification, the radio frequency of the carrier wave to modify the information signals are set to $\omega_{RF}$.

Gates of the second active element and the third element are connected to each other and connected to the LO frequency input terminal LO. The first power supply is applied to the gates of the second active element and the third active element to maintain driving bias voltage via bias and impedance Zgn3 of gate side.

It is preferable that the frequency $\omega_{LO}$ of the signal inputted to the LO frequency input terminal LO is a half of the carrier wave frequency $\omega_{RF}$ for the embodiment shown in FIG. 3 to operate as a mixer circuit. The LO frequency signal may be generated by the local oscillator.

As described above, the first power supply is applied to the gates of the first active element through the fourth active element to maintain driving bias voltage via biases and impedances Zgn1, Zgn2, Zgn3 and Zgn4 of gate side. The driving bias voltage is appropriately set according to the types of the first active element through the fourth active element. For example, if the first through fourth active elements of FIG. 3 were N-type MOSFETs, the bias voltage is maintained to DC voltage between gate and source of N-type MOSFET to operate each active element within a preferable operating region. This is called as N-type MOSFET bias voltage NMOS_BIAS in this specification.

The source voltage Vsn and the body voltage Vbn are applied to the source terminals and body terminals of each active elements Qn1, Qn2, Qn3 and Qn4. According to preferred embodiment of the present invention, a bias part, which is connected to the power supply, is connected between the source terminal and the body terminal of each active element Qn. Therefore, the source voltage Vsn and the body voltage Vbn are regulated from the power supply through the bias part. In this specification, the bias part connected between the power supply, the source terminal and the body terminal is called as operating point bias part.

The output terminals of the first mixer and the second mixer are cross-connected to each other. That is, the drains of the first active element and the third active element are connected to each other and connected to the first output terminal IF−. The drains of the second active element and the fourth active element are connected to each other and connected to the second output terminal IF+. The final output may be obtained by differentiating the signals of the first output terminal IF− and the second output terminal IF+.

The connection point of the drains of the first active element and the third active element is connected to the first power supply via the prescribed bias and impedance part Zdn1 of drain side. The connection point of the drains of the second active element and the fourth active element is connected to the second power supply via the prescribed bias and impedance part Zdn2 of drain side. In this specification, the bias part connected between the drain and the output terminal as output side bias part.

As described above, the radio frequency signals RF− and RF+ having reverse phases are inputted to the first mixer circuit and the second mixer circuit. The same LO signal LO is inputted to the first mixer circuit and the second mixer circuit. It is preferable that the frequency $\omega_{LO}$ of the signal inputted to the LO frequency input terminal LO is substantially a half of the carrier wave frequency $\omega_{RF}$. Then, the output of the whole circuit, that is, the differential signal of the first output terminal IF− and the second output terminal IF+ has the form of pulse stream having narrow width. Then, the width of the pulse stream is proportional to the amplitude of the RF signal.

According to the circuit shown in FIG. 3, the output signal of the whole circuit has a form of pulse width modulation signal modified to be the width proportional to the amplitude of the RF signal. Therefore, the output signals does not comprise the undesired LO signal component substantially but the desired baseband signal included in the frequency signal modified by the carrier wave signal having frequency of $\omega_{RF}$. It does mean that DC offset is improved.

Moreover, LO signal components are rarely leaked to the first radio frequency input terminal RF− and the second radio frequency input terminal RF+ in the case that the first mixer circuit and the second mixer circuit have nearly the same scale and the same structure. It can be achieved by forming the active elements constituting the first mixer circuit and the second mixer circuit on the same substrate and the same layer.

FIG. 4 shows the complementary circuit to the circuit shown in FIG. 3 using P-type MOSFET having complementary characteristics to the N-type MOSFET.

The above description about FIG. 3 can be applicable to the circuit shown in FIG. 4, since the circuit shown in FIG. 4 is formed complementarily to the circuit shown in FIG. 3.

In the embodiment shown in FIG. 4, the first power supply is applied to the gates of the first active element through the fourth active element to maintain driving bias voltage via biases and impedances Zgn1, Zgn2, Zgn3 and Zgn4 of gate side, too. The driving bias voltage is appropriately set according to the types of the first active element through the fourth active element. For example, if the first through fourth active elements of FIG. 4 were P-type MOSFETs, the bias voltage is maintained to DC voltage between gate and source of P-type MOSFET to operate each active element within a preferable operating region. This is called as P-type MOSFET bias voltage PMOS_BIAS in this specification.

In addition, it is described that, for the first mixer circuit, the sources of the first active elements Qn1 and the second active element Qn2 are connected to each other and connected to the first power supply via the prescribed bias and impedance Zsn1 of source side and, for the second mixer circuit, the sources of the third active elements Qn3 and the fourth active element Qn4 are connected to each other and connected to the second power supply via the prescribed bias and impedance Zsn2 of source side. According to the preferred embodiment of the present invention, they may be earthed instead of connecting to the second power supply. On the other hand, it is preferable that, for the first mixer circuit, the sources of the first active elements Qp1 and the second active element Qp2 are connected to each other and connected to the first power supply via the prescribed bias and impedance Zsp1 of source side, and, for the second mixer circuit, the sources of the third active elements Qp3 and the fourth active element Qp4 are connected to each other and connected to the second power supply via the prescribed bias and impedance Zsp2 of source side in FIG. 4.

Moreover, according to FIG. 3, the connection point of the drains of the first active element Qn1 and the third active element Qn3 is connected to the first power supply via the prescribed bias and impedance part Zdn1 of drain side, and the connection point of the drains of the second active element Qn2 and the fourth active element Qn4 is connected to the second power supply via the prescribed bias and impedance part Zdn2 of drain side. According to FIG. 4, the connection point of the drains of the first active element Qp1 and the third active element Qp3 is connected to the first power supply via the prescribed bias and impedance part Zdp1 of drain side, and the connection point of the drains of the second active element Qp2 and the fourth active element Qp4 is connected to the second power supply via the prescribed bias and impedance part Zdn2 of drain side.

The first power supply is, for example, a + power supply in this embodiment and the whole part of this specification. According to the preferred embodiment of the present invention, the + power supply is a power supplying source which can be provide with the standardized positive voltage such as +3V, +5V, etc. The second power supply is, for example, a − power supply in this embodiment and the whole part of this specification. According to the preferred embodiment of the present invention, the + power supply is a power supplying source which can be provide with the standardized negative voltage such as −3V, −5V, etc. In some case, it is possible that one of the first power supply and the second power supply is earthed and the other is set to + power supply or − power supply. This modification does not interpret the idea of the present invention to be cut down.

The Second Embodiment of the Mixer Circuit

The main non-linearity of the whole circuit may be due to the non-linearity of the transconductance gm of the active elements for the embodiments shown in FIGS. 3 and 4.

If the input signal having two frequency components f1 and f2 is applied to a general nonlinear circuit, the frequency components of 2*f1, 2*f2, f1−f2, f1+f2, 3*f1, 3*f2, 2*f1−f2, 2*f2−f1, 2*f1+f2, 2*f2+f1, and etc. as well as the frequency of the inputted signal due to the non-linearity of the circuit itself.

The frequency components due to the non-linearity are generally eliminated by the filter centering around the desired frequency to obtain as the output.

As for the application in which the input frequencies f1 and f2 are nearly the same and the desired frequency of the output is set to baseband, the component of f1−f2 which is about the same as the baseband among the frequency components due to the non-linearity. These components show the phenomenon that the channels having a small frequency difference interfere with each other or distort the signal by interference between the signals within the signal band with each other. This f1−f2 component is called as second order intermodulation distortion (IMD2). The linearity of the circuit can be expressed by the relation between the quantity of IMD2 and the amplified quantity of input frequency. This value indicating the linearity of the circuit is called second order intercept point (IP2).

FIGS. 3 and 4, the drain current of the active element can be expressed as having the relation with the voltage between gate and source Vgs and the transconductance gm shown in equation 1.

$$i_{DS} = I_{DC} + g_m v_{gs} + \frac{g_m'}{2!} v_{gs}^2 + \frac{g_m''}{3!} v_{gs}^3 + \dots \quad \text{[Equation 1]}$$

In equation 1, the coefficient of the square of the voltage between gate and source $v_{gs}^2$, i.e. the first differential equation gm' of gm to the voltage between gate and source of the active element is known as to have a great effect to the second order intermodulation distortion (IMD2) and the second order intercept point (IP2).

FIG. 5 is a graph illustrating the drain current IDS, transconductance gm, and first differential equation gm' of the transconductance to the voltage Vgs between gate and source. FIG. 5 shows the graph for the P-type and N-type MOSFET, however, nearly the same graphs can be obtained by any of the active elements having similar characteristics of the drain current to the voltage between gate and source.

As it is known from FIG. 5, active elements complementary to each other have the characteristic that the drain currents $I_{DS}$, transconductances gm, and first differential equations gm' of the transconductances to the voltages Vgs between gate and source are substantially symmetrical. In addition, the first differential equations gm' of the transconductances to the voltages Vgs between gate and source of N-type MOSFET has a maximum value in the region where the voltage between gate and source is a prescribed positive value $V_{GSN}$, and the first differential equations gm' of the transconductances to the voltages Vgs between gate and source of P-type MOSFET has a minimum value in the region where the voltage between gate and source is a prescribed negative value $V_{GSN}$. According to the actual embodiment of the present invention, the voltage $V_{GSN}-V_{TH}$ in which the threshold voltage $V_{TH}$ is subtracted from the voltage Vgs between gate and source in which the first differential equations gm' of the transconductances to the voltages Vgs between gate and source of N-type MOSFET has a maximum value is about 0.3 V, and the voltage $V_{GSP}-V_{TH}$ in which the threshold voltage $V_{TH}$ is subtracted from the voltage Vgs between gate and source in which the first differential equations gm' of the transconductances to the voltages Vgs between gate and source of P-type MOS- FET has a minimum value is about −0.2 V. As shown in the above, the N-type MOSFET and the P-type MOSFET may show the difference in characteristics.

It is preferable that the active elements are operating in the range that the voltage Vgs–Vth in which the threshold voltage is subtracted from the voltage between gate and source is, for example, in 0.2 V~0.3 V to obtain a sufficient RF gain which is substantially equal to that which can be obtained in the saturated region while the small amount of DC power is consumed. However, as described in the above, the first differential equations gm' of the transconductances has a maximum or minimum value. That is, in the operating region in which the sufficient RF gain is obtained while the small amount of DC power is consumed for the active element, the first differential equations gm' of the transconductances unfortunately has a maximum or minimum value, thereby the non-linearity is maximized.

Therefore, it is possible to accord the regions in which the first differential equations gm' of the transconductances of the first type active element and the second type active element which are complementary to each other have the maximum and minimum values by connecting the drains of the first type active element and the second type active element, pertinently establishing the bias voltage between gate and source, and applying the same input signal to the gates. According to the preferred embodiment of the present invention, it is possible to accord the regions in which the first differential equations gm' of the transconductances of the two active elements have the maximum and minimum values by establishing the bias voltage between gate and source of the first type active element to the region $V_{GSN}$ where the first differential equations gm' of the transconductance have the maximum value and establishing the bias voltage between gate and source of the second type active element to the region $V_{GSP}$ where the first differential equations gm' of the transconductance have the minimum value. By doing this, it is possible to offset the values of the first differential equations gm' of two active elements having the maximum or the minimum value. FIG. 6 shows the circuit composed as the drains of N-type MOSFET and P-type MOSFET are connected to each other and to be biased in the region in which the having the maximum or the minimum value, and the graph illustrating the values of the first differential equations of transconductances of two elements of the same circuit.

That is, in case that the first type active element Qn is biased by the prescribed the voltage between gate and source, it is offset the value of the first differential equation gm' of the first type active element Qn having the maximum value using the first differential equation gm' of the second type active element Qp by biasing the opposite voltage of the voltage between gate and source of the first type active element to between gate and source of the second type active element Qp.

FIG. 7 is a circuit diagram showing a mixer circuit whose linearity is improved using the active elements which are complementary to each other according to the preferred embodiment of the present invention.

As shown in FIG. 7, the amplifying circuit whose linearity is improved using the active elements which are complementary to each other according to the present invention comprises the first mixer circuit part implemented by the first type active element, and the second mixer circuit part implemented by the second type active element complementary to the first type.

The complementary elements of the first and the second types have the gates Ng, Pg, sources Ns, Ps, and drains Nd, Pd, respectively. The amount and direction of the current from the source to the drain of the first type complementary element is determined according to the voltage applied to the gate. The amount and direction of the current from the source to the drain of the second type complementary element is determined according to the voltage applied to the gate, however, it is determined complementarily to the first type complementary element.

That is, in case that the amount and direction of the current from the drain to the source of the first type complementary element changes proportional to the voltage between gate and source, the amount and direction of the current from the source to the drain of the second type complementary element changes proportional to the voltage between source and gate. In addition, the bias and impedance circuits of the first type mixer circuit and the second type mixer circuit determines the operating point of the first active element and the second active element for only the first type active element is to be substantially activated or for only the second type active element is to be substantially activated according to the polarity of the input signal. In the following description, it is assumed that the first type complementary element is N-type MOSFET, and the second type complementary element is P-type MOSFET, but the idea of the present invention is not confined thereto as apparent to those skilled in the art.

As shown in FIG. 5, the first type mixer circuit has the same structure as the mixer circuit using N-type MOSFET as described above with reference to FIG. 3. In addition, the second type mixer circuit has the same structure as the mixer circuit using P-type MOSFET as described above with reference to FIG. 4.

The first type mixer circuit comprises the first mixer circuit including the first active element Qn11 and the second active element Qn12 of the first type, and the second mixer circuit including the third active element Qn21 and the fourth active element Qn22. The second type mixer circuit comprises the first mixer circuit including the first active element Qp11 and the second active element Qp12 of the second type, and the second mixer circuit including the third active element Qp21 and the fourth active element Qp22.

The first mixer circuit and the second mixer circuit have constitutions of source-coupled pair for the first and second type mixer circuit parts. That is, for the first type mixer circuit part, the sources of the first active elements Qn11 and the second active element Qn12 of the first mixer circuit are connected to each other and connected to the second power supply via the prescribed bias and impedance Zsn1 of source side, and the sources of the third active elements Qn21 and the fourth active element Qn22 of the second mixer circuit are connected to each other and connected to the second power supply via the prescribed bias and impedance Zsn2 of source side. According to the preferred embodiment of the present invention, they may be earthed instead of connecting to the second power supply.

On the other hand, for the second type mixer circuit part, the sources of the first active elements Qp11 and the second active element Qp12 of the first mixer circuit are connected to each other and connected to the first power supply via the prescribed bias and impedance Zsp1 of source side, and the sources of the third active elements Qp21 and the fourth active element Qp22 of the second mixer circuit are connected to each other and connected to the second power supply via the prescribed bias and impedance Zsp2 of source side.

Gates of the first active element Qn11 of the first type mixer circuit part and the first active element Qp11 of the second type mixer circuit part are connected to the first radio frequency input terminal RF−. Gates of the fourth active element Qn22 of the first type mixer circuit part and the fourth active element Qp22 of the second type mixer circuit part are connected to the second radio frequency input terminal RF+. The first power supply is applied to the gates of the first active element and the fourth active element to maintain driving bias voltage via biases and impedances Zgn1, Zgn2, Zgp1, and Zgp2 of gate sides respectively.

For the embodiment shown in FIG. 7, the first power supply is applied to the gates of the first to the fourth active elements of the first type mixer circuit part and the second type mixer circuit part to maintain driving bias voltage via biases and impedances Zgn1, Zgn2, Zgn3, Zgn4, Zgp1, Zgp2, Zgp3, and Zgp4 of gate sides respectively. The driving bias voltage is appropriately set according to the types of the first active element through the fourth active element, i.e. the type of which the first or the second. For example, if the active elements forming the first type mixer circuit part of FIG. 3 were N-type MOSFETs, the N-type bias voltage as described with reference to FIG. 3 is maintained, and if the active elements forming the second type mixer circuit part were P-type MOSFETs, the P-type bias voltage as described with reference to FIG. 4 is maintained. According to the preferred embodiment of the present invention, it is possible to accord the regions in which the first differential equations gm' of the transconductances of the two active elements have the maximum and minimum values by establishing the bias voltage between gate and source of the N-type MOSFET to the region $V_{GSN}$ where the first differential equations gm' of the transconductance have the maximum value and establishing the bias voltage between gate and source of the P-type MOSFET to the region $V_{GSP}$ where the first differential equations gm' of the transconductance have the minimum value. By doing this, it is possible to offset the values of the first differential equations gm' of two active elements having the maximum or the minimum value.

It is preferable that the radio frequency signals having reverse phases are applied to the first radio frequency input terminal RF− and the second radio frequency input terminal RF+ for the embodiment shown in FIG. 7 to act as the mixer circuit. The radio frequency signals inputted to the first radio frequency input terminal RF− and the second radio frequency input terminal RF+ are the signals in which the information signals are modified by the carrier wave having prescribed radio frequency. In this specification, the radio frequency of the carrier wave to modify the information signals are set to $\omega_{RF}$.

Gates of the second active element Qn12 and the third element Qn21 of the first type mixer circuit part are connected to each other and connected to the LO frequency input terminal LO. Gates of the second active element Qp12 and the third element Qp21 of the second type mixer circuit part are also connected to each other and connected to the LO frequency input terminal LO. The first power supply is applied to the gates of the second active element Qn12 and the third element Qn21 of the first type mixer circuit part and gates of the second active element Qp12 and the third element Qp21 of the second type mixer circuit part to maintain driving bias voltage via bias and impedance Zgn3 and Zgp3 of gate side, respectively.

It is preferable that the frequency $\omega_{LO}$ of the signal inputted to the LO frequency input terminal LO is a half of the carrier wave frequency $\omega_{RF}$ for the embodiment shown in FIG. 7 to operate as a mixer circuit.

It is described that the radio frequency signals RF+ and RF− having reverse phases and carrier wave frequency $\omega_{RF}$ are applied to the gates of the first and the fourth active elements, and LO signal is applied to the gates of the second and the third active elements. However, according to another embodiment of the present invention, it is possible that LO signal is applied to the gates of the first and the fourth active elements, and LO signal is applied to the gates of the second and the third active elements. This type of embodiment is advantageous in the case that the radio frequency signals RF+ and RF− having reverse phases are hardly obtained from the signals having carrier wave frequency $\omega_{RF}$. The concept of the present invention is still applicable to the latter embodiment.

The source voltage Vsn and the body voltage Vbn are applied to the source terminals and body terminals of each active element. According to the preferred embodiment of the present invention, a bias part, which is connected to the power supply, is connected between the source terminal and the body terminal of each active element Qn. Therefore, the source voltage Vsn and the body voltage Vbn are regulated from the power supply through the bias part. In this specification, the bias part connected between the power supply, the source terminal and the body terminal is called as operating point bias part.

The output terminals of the first mixer and the second mixer are cross-connected to each other for the first mixer circuit part and the second mixer circuit part. That is, the drains of the first active element and the third active element are connected to each other and connected to the first output terminal IF−. The drains of the second active element and the fourth active element are connected to each other and connected to the second output terminal IF+. The final output may be obtained by differentiating the signals of the first output terminal IF− and the second output terminal IF+.

In addition, the drains of the corresponding active elements of the first mixer circuit part and the second mixer circuit part are cross-connected. That is, the drains of the first active elements through the fourth active elements of the first mixer circuit part are connected respectively to the drains of the first active elements through the fourth active elements of the second mixer circuit part. Therefore, each of the complementary active element pairs constitutes the complementary pair shown in FIG. 6.

The connection point of the drains of the first active element and the third active element is connected to the first power supply via the prescribed bias and impedance parts Zdn1 and Zdp1 of drain side for the first mixer circuit part and the second mixer circuit part. The connection point of the drains of the second active element and the fourth active element is connected to the second power supply via the prescribed bias and impedance parts Zdn2 and Zdp2 of drain side. In this specification, the bias part connected between the drain and the output terminal as output side bias part.

The radio frequency signals RF− and RF+ having reverse phases are inputted to the gates of the first mixer circuit and the second mixer circuit of the first mixer circuit part and the second mixer circuit part. The same LO signal LO is inputted to the other gates of the first mixer circuit and the second mixer circuit. It is preferable that the frequency $\omega_{LO}$ of the signal inputted to the LO frequency input terminal LO is substantially a half of the carrier wave frequency $\omega_{RF}$. Then, the output of the whole circuit, that is, the differential signal of the first output terminal IF− and the second output terminal IF+ has the form of pulse stream having narrow width. Then, the width of the pulse stream is proportional to the amplitude of the RF signal.

According to the circuit shown in FIG. 7, the output signal of the whole circuit has a form of pulse width modulation signal modified to be the width proportional to the amplitude of the RF signal. Therefore, the output signals does not comprise the undesired LO signal component substantially but the desired baseband signal included in the frequency signal modified by the carrier wave signal having frequency of $\omega_{RF}$. It does mean that DC offset is improved. Moreover, in the case that the first mixer circuit and the second mixer circuit have substantially the same scale and structure, the LO signal component is scarcely leaked at the first radio frequency input terminal RF− and the second radio frequency input terminal RF+. These results are the same as those obtainable from the embodiment relevant to FIGS. 3 and 4 described above.

The circuit shown in FIG. 7, as described above, each of the complementary active element pairs constitutes the complementary pair shown in FIG. 6 by connecting the drains of the first active elements through the fourth active elements of the first mixer circuit part respectively to the drains of the first active elements through the fourth active elements of the second mixer circuit part. Therefore, it is possible to offset the value of the first differential equation gm' of the first type active element Qn having the maximum value using the first differential equation gm' of the second type active element Qp and vice versa among the non-linearities of all active elements as described with reference to FIG. 6.

This means that IMD2 of the circuit shown in FIG. 7 is improved. Therefore, the circuit shown in FIG. 7 has advantages that the even order function non-linearity is considerably improved.

The Third Embodiment of the Mixer Circuit

FIG. 8 is a circuit diagram illustrating the first embodiment of the mixer circuit in which the DC offset is cut off according to the present invention.

The mixer circuit according to the present invention comprises a separator 801 separating the radio frequency input signal RF to the first signal and the second signal having the same phases, a local oscillator 803 generating local frequency signal LO, phase transformer 805 phase-transforming the local frequency signal LO to substantially 180 degree, a first mixer 807 mixing the first signal and the local frequency signal LO whose phase is transformed to 180 degree, a second mixer 809 mixing the second signal and the local frequency signal LO, and a subtractor 811 subtracting the output signal of the second mixer 809 from the output signal of the first mixer 807.

FIG. 9 is to explain the operation of the circuit shown in FIG. 8. As shown in FIG. 9, the case that the radio frequency input signal RF is inputted to the input terminal of the mixer circuit shown in FIG. 8 is described as an example. In this example, the radio frequency input signal RF is a sine wave 901 whose frequency is Wr, and the local frequency signal LO is a sine wave whose frequency is Wo. The sine wave 901 applied to the input terminal and the local frequency signal LO generated from the local oscillator 803 are expressed as the equation 2 and equation 3, respectively.

$$V_{RF}=\sqrt{2} \cdot V_r \cdot \text{Cos}(w_r t) \quad \text{[Equation 2]}$$

$$V_{LO}=\sqrt{2} \cdot V_o \cdot \text{Cos}(w_o t) \quad \text{[Equation 3]}$$

The sine wave 901 and the signal in which the local frequency signal LO is phase-transformed to about 180 degree are inputted to the first mixer 807. The sine wave 901 and the local frequency signal LO are inputted to the second mixer 809. The operation generated in the first mixer 807 and the second mixer 809 can be approximated that the signal having both of the sine wave 901 component and the local frequency signal LO component is inputted and passes the transmission function, for example, equation 6, of the non-linear function such as square function.

$$V_1=V_r \cdot \text{Cos}(w_r t)+V_o \cdot \text{Cos}(w_o t) \quad \text{[Equation 4]}$$

$$V_2=V_r \cdot \text{Cos}(w_r t)-V_o \cdot \text{Cos}(w_o t) \quad \text{[Equation 5]}$$

$$V_o=k \cdot V_i^2 \quad \text{[Equation 6]}$$

Equation 7 and equation 8 are the expressions of the signals, indicated by each of the equation 4 and the equation 5, passed the transmission function of non-linear function approximated by the equation 6, respectively.

$$V_{o1}=k \cdot [V_r^2 \cdot \text{Cos}(w_r t)^2+V_o^2 \cdot \text{Cos}(w_o t)^2+2V_r V_o \cdot \text{Cos}(w_r t) \text{Cos}(w_o t)] \quad \text{[Equation 7]}$$

$$V_{o2}=k \cdot [V_r^2 \cdot \text{Cos}(w_r t)^2+V_o^2 \cdot \text{Cos}(w_o t)^2-2V_r V_o \cdot \text{Cos}(w_r t) \text{Cos}(w_o t)] \quad \text{[Equation 8]}$$

It is preferable that the operation generated in the first mixer 807 and the second mixer 809 is approximated to further comprise the low pass filter operation on the signal passed through the transmission function of non-linear function expressed as equation 6. Equation 9 and equation 10 are the approximations of the signals expressed by the equation 7 and equation 8 after passing the low pass filter operation.

$$V'_{o1} = k \cdot \left[ \frac{V_r^2}{2} + \frac{V_o^2}{2} + V_r V_o \cdot \text{Cos}(w_r - w_o)t \right] \quad \text{[Equation 9]}$$

$$V'_{o2} = k \cdot \left[ \frac{V_r^2}{2} + \frac{V_o^2}{2} - V_r V_o \cdot \text{Cos}(w_r - w_o)t \right] \quad \text{[Equation 10]}$$

That is, the equation 9 and the equation 10 are the approximations of the output signals 907 and 909 of the first mixer 807 and the second mixer 809, respectively. As it is known from the equation 9 and the equation 10, the output signals 907 and 909 of the first mixer 807 and the second mixer 909 have both of DC component and the signal having the frequency Wr−Wo of the difference between the radio frequency of the input signal Wr and the local frequency Wo, i.e. Cos(Wr−Wo). The DC components have the same phases, and the signals having the frequency Wr−Wo of the difference between the radio frequency of the input signal Wr and the local frequency Wo have the phases different by 180 degree from each other in the output signal 907 and 909 of the first mixer 807 and the second mixer 809.

The subtractor 811 subtracts the output signal 909 of the second mixer 809 from the output signal 907 of the first mixer 807. Equation 11 is an approximation of the signal in which the output signal 909 of the second mixer 809 approximated by the equation 10 is subtracted from the output signal 907 of the first mixer 807 approximated by the equation 9.

$$V_{IF}=2kV_r V_o \cdot \text{Cos}(w_r-w_o)t \quad \text{[Equation 11]}$$

As it is known from the final output signal 911 of FIG. 9, the signal in which the output signal 909 of the second mixer 809 is subtracted from the output signal 907 of the first mixer 807 comprises little DC component. Therefore, various shortcomings due to DC offset voltage can be suppressed.

The Fourth Embodiment of the Mixer Circuit

FIG. 10 is a circuit diagram illustrating the second embodiment of the mixer circuit in which the DC offset is cut off according to the present invention.

The second embodiment of the mixer circuit according to the present invention comprises a separator 1001 separating the radio frequency input signal RF to the first signal and the second signal having the phases different by about 180 degrees from each other, a local oscillator 1003 generating local frequency signal LO, a first mixer 1007 mixing the first signal and the local frequency signal LO, a second mixer 1009 mixing the second signal and the local frequency signal LO, and a subtractor 1011 subtracting the output signal of the second mixer 1009 from the output signal of the first mixer 1007.

The case that the radio frequency input signal RF is inputted to the input terminal of the mixer circuit shown in FIG. 10 is described as an example with reference to FIG. 9 which is to explain the operation of the circuit according to the present invention as described above. In this example, similar to those described above, the radio frequency input signal RF is a sine wave whose frequency is Wr, and the local frequency signal LO is a sine wave whose frequency is Wo. The sine wave applied to the input terminal and the local frequency signal LO generated from the local oscillator 1003 are expressed as the equation 2 and equation 3 as described above, respectively.

The radio frequency input signal RF and the local frequency signal LO are inputted to the first mixer 1007. The signal in which the radio frequency input signal RF is phase-transformed to about 180 degrees and the local frequency signal LO are inputted to the second mixer 1009. It is possible that the signal in which the radio frequency input signal RF is phase-transformed to about 180 degrees is inputted to the first mixer 1007, and the radio frequency input signal RF is inputted to the second mixer 1007, since the signals inputted to the first mixer 1007 and the second mixer 1009 are required to only have 180 degrees phase difference.

The operation generated in the first mixer 807 and the second mixer 809 can be approximated that the signal having both of the radio frequency input signal RF and the local frequency signal LO component as in equation 12 and equation 13 is inputted and passes the transmission function, for example, equation 6 as described above, of the non-linear function such as square function.

$$V_1 = V_r \cdot \mathrm{Cos}(w_r t) + V_o \cdot \mathrm{Cos}(w_o t) \quad \text{[Equation 12]}$$

$$V_2 = -V_r \cdot \mathrm{Cos}(w_r t) + V_o \cdot \mathrm{Cos}(w_o t) \quad \text{[Equation 13]}$$

The signals of the equation 4 and the equation 5 passed the transmission function of non-linear function approximated by the equation 6 are expressed as the equation 7 and equation 8 as described above.

It is preferable that the operation generated in the first mixer 807 and the second mixer 809 is approximated to further comprise the low pass filter operation on the signal passed through the transmission function of non-linear function expressed as equation 6. Equation 9 and equation 10 are the approximations of the signals expressed by the equation 7 and equation 8 after passing the low pass filter operation.

That is, the equation 9 and the equation 10 are the approximations of the output signals 907 and 909 of the first mixer 807 and the second mixer 809, respectively. As it is known from the equation 9 and the equation 10, the output signals 907 and 909 of the first mixer 807 and the second mixer 909 have both of DC component and the signal having the frequency Wr–Wo of the difference between the radio frequency of the input signal Wr and the local frequency Wo, i.e. Cos(Wr–Wo). The DC components have the same phases, and the signals having the frequency Wr–Wo of the difference between the radio frequency of the input signal Wr and the local frequency Wo have the phases different by 180 degree from each other in the output signal 907 and 909 of the first mixer 807 and the second mixer 809.

The subtractor 811 subtracts the output signal 909 of the second mixer 809 from the output signal 907 of the first mixer 807. Equation 11 is an approximation of the signal in which the output signal 909 of the second mixer 809 approximated by the equation 10 is subtracted from the output signal 907 of the first mixer 807 approximated by the equation 9.

The second embodiment of the mixer circuit in which DC offset is cut off according to the present invention also has all advantages of the first embodiment described above.

Fifth Embodiment of the Mixer Circuit

According to another embodiment of the present invention, the mixer circuit according to the present invention may be designed to output differential signals as a whole. FIG. 16 is an embodiment of the mixer circuit in which the first embodiment of the present invention designed to output differential signals. In addition, FIG. 17 is an embodiment of the mixer circuit in which the second embodiment of the present invention designed to output differential signals. According to the embodiment shown in FIG. 16, the first mixer 807 and the second mixer 809 can be implemented as differential circuits. In this case, the first mixer 807 and the second mixer 809 output two output signals whose polarity are opposite to each other, i.e. a positive signal and a negative signal. Additionally, the embodiment further comprises a first subtractor 1611 subtracting the positive output signals of the first mixer 807 and the second mixer 809, and a second subtractor 1612 subtracting the negative output signals of the first mixer 807 and the second mixer 809. According to the embodiment shown in FIG. 17, the first mixer 1007 and the second mixer 1009 can be implemented as differential circuits. In addition, the embodiment further comprises a first subtractor 1711 subtracting the positive output signals of the first mixer 1007 and the second mixer 1009, and a second subtractor 1712 subtracting the negative output signals of the first mixer 1007 and the second mixer 1009. Thus, the extra advantage in which the common mode noise are cut off is obtained.

Measurement and Compensation of the Phase and the Gain Mismatching

Now, the circuit having means for measuring and compensating the phase and the gain mismatching of the mixer circuit in which DC offset is cut off according to the present invention. The method for measuring and compensating the phase and the gain mismatching which will be described in the following is applicable to both of the first and the second embodiments of the mixer circuit in which DC offset is cut off according to the present invention. The following description will be concentrated to the first embodiment for an example, however, the idea of the present invention which will be described in the following is not confined to the first embodiment and applicable to the similar circuits as well as the second embodiment.

FIG. 11 is a block diagram illustrating another embodiment of the mixer circuit according to the present invention. The circuit shown in FIG. 11 has a means for measuring and compensating the phase mismatching in the case that the phase difference between the local frequency signal LO and the signal in which the local frequency signal is 180 degrees phase-transformed is different from 180 degrees and the gain mismatching in the case that the gains of first mixer 807 and the second mixer circuit are different. The circuit drawn in FIG. 12 has a means for measuring and compensating the phase mismatching and the gain mismatching for the second embodiment shown in FIG. 10. Now, it is described laying stress on the first embodiment.

As shown in FIG. 11, another embodiment of the mixer circuit according to the present invention comprises a phase compensating means and a gain compensating means besides the constitutions of the embodiment shown in FIG. 8.

The phase compensating means includes a first phase compensating means 1101 for compensating the phase of the signal in which the local frequency signal LO is phase-transformed by the phase transformer 805, and a second phase compensating means 1103 for compensating the phase of the signal before the local frequency signal LO is inputted to the second mixer 809. In addition, according to FIG. 12, the first phase compensating means and the second phase compensating means for compensating the phase of the local frequency signal LO and inputting to the first mixer 1007 and the second mixer 1009, respectively for the second embodiment.

The phase compensating means has an input terminal for control voltage and preferably is the element whose phase transformation value is changed according to the amount of the control voltage inputted to the input terminal for control voltage. For example, voltage control variable capacitor, i.e. varactor may be used as an example of the phase compensating means.

The gain compensating means comprises a first gain compensating means 1105 and a second gain compensating means 1107 for compensating gains of outputs of the first mixer 807 and 1007 and the second mixer 809 and 1009, respectively.

Voltage control variable gain passive or active elements may be used as gain compensating means.

The phase mismatching can be compensated by applying a reference voltage Vref_1 to one phase compensation means, for example, the second phase compensation means, and varying the voltage applied to the other phase compensation means, for example, the first phase compensation means to obtain the applied voltage value compensating the phase mismatching. The gain mismatching can be compensated by applying a reference voltage Vref_2 to one gain compensation means, for example, the second gain compensation means, and varying the voltage applied to the other gain compensation means, for example, the first gain compensation means to obtain the applied voltage value compensating the phase mismatching.

FIG. 13 shows another embodiment of the mixer circuit having means for phase compensation and gain compensation according to the present invention. The embodiment shown in FIG. 13 has an additional circuit to perform the phase and gain compensation operation as shown in FIG. 11. The circuit shown in FIG. 13 is applicable to the second embodiment of the mixer circuit shown in FIGS. 10 and 12 according to the present invention.

The embodiment shown in FIG. 13 further comprises a power detector 1301, and a switch 1301 for connecting the radio frequency input signal RF inputted to the input terminal or switching it to the power detector 1301 as well as the embodiment shown in FIG. 11.

The circuit shown in FIG. 13 is preferably implemented as a form of integrated circuit (IC). The following mismatching measurement and compensation operation is performed when the power is first applied to the circuit or the IC comprising the same circuit. Then, the parameters determined by the mismatching measurement and compensation operation, etc. are recorded on the memory device prepared for the circuit or the IC, for example, flash ROM. The circuit or the IC operate according to the parameter recorded on the memory device. Therefore, it is preferable that the circuit or IC shown in FIG. 13 further comprises a detector for detecting whether the power is applied first, and the memory device to record the parameters for compensating the mismatching.

Now, the measurement and compensation operations of the embodiment shown in FIG. 13 are described in detail.

If the power is applied first to the circuit shown in FIG. 13, the detector for detecting whether the power is applied first detects it, and the switch 1301 switches the input terminal inputted to the separator 801 to the power detector 1303. According to another embodiment of the present invention, the detector for detecting whether the power is applied first is not separately prepared, and the switch 1301 is set to connect the input terminal of the separator 801 to the power detector 1303 from the beginning.

The local oscillator generates a prescribed local frequency signal LO. The local frequency signal LO is outputted through the subtractor 811 via the first signal path passing the phase transformer 805, the first phase compensation means 1001, the first mixer 807, and the first gain compensation means 1105 he second signal path passing the second phase compensation means 1103, the second mixer 809, and the second gain compensation means 1107. Here, a prescribed power is detected at the power detector 1303 if there is phase mismatching or gain mismatching.

A prescribed reference voltage Vref_1 is applied to the control voltage input terminal to make the prescribed phase change on the signal on the second signal path for phase mismatching compensation. At the same time, the control voltage applied to the control voltage input terminal of the first phase compensation means 1101 is gradually varied to determine the control voltage in which the substantially zero (0) power is detected at the power detector 1303. In this specification, the control voltage of the first phase compensation means 1101 determined as described above is called a control voltage for phase compensation.

A prescribed reference voltage Vref_2 is applied to the control voltage input terminal of the second gain compensation means 1107 to make the prescribed gain change on the signal on the second signal path for phase mismatching compensation. At the same time, the control voltage applied to the control voltage input terminal of the first gain compensation means 1105 is gradually varied to determine the control voltage in which the substantially zero (0) power is detected at the power detector 1303. As the method for gradually varying the control voltage, the traditional method of increasing or decreasing the control voltage discretely in the variable range of the control voltage.

In this specification, the control voltage of the first gain compensation means 1105 determined as described above is called a control voltage for gain compensation.

The control voltage value for phase compensation and the control voltage value for gain compensation determined as described above are recorded to the memory device. The voltage values recorded to the memory device are read and applied to the control voltage input terminals of the first phase compensation means 1101 and the second gain compensation means 1105 as the parameters for circuit operation whenever the circuit operates.

Then, the switch 1301 switches the input terminal of the separator 1301 to the input terminal of the whole circuit.

After determining the determined control voltages for phase and gain compensation, the whole circuit operates according to the determined control voltages for phase and gain compensation. Though the power is supplied again, the measurement and compensation operations for the gain and phase mismatching are not performed any more by the switch 1301 which does not perform the switching operation and connects the input terminal of the whole circuit to the separator 801.

For this, an embodiment of the present invention may comprise a means for detecting the determination of the control voltage for phase and gain compensation and stopping the operation of the detector for detecting whether the power is applied first in response to detecting the determination of the control voltage. According to another embodiment of the present invention, a means for detecting the recording of the control voltage for phase and gain compensation to the recording medium and stopping the operation of the detector for detecting whether the power is applied first in response to detecting the recording of the control voltage may be included.

In the above described embodiment, the control voltage applied to the control voltage input terminal of the first gain compensation means 1105 or of the first phase compensation means 1101 is gradually varied to determine the control voltage in which the substantially zero (0) power is detected at the power detector 1303. According to another embodiment of the present invention, the control voltage for phase and gain compensation based on the detected power values detected on the power detector according to the input of the limited numbers of control voltages without varying gradually the control voltage.

FIG. 14 is a graph showing an example of the change of the detected power Vd according to the phase mismatching Δϕ, gain mismatching ΔG, or control voltage Vc. The graph of FIG. 14 is approximated based on the characteristics of the elements forming the whole circuit. For example, the change of the detected power Vd can be approximated to the second order function of equation 14 if the MOS elements are used.

$$a \cdot V_c^2 + b \cdot V_c + c = V_d \quad \text{[Equation 14]}$$

Therefore, three coefficients a, b and c are calculated by applying the control voltages corresponding to three points A, B and C and detecting the power detected on the power detector 1103 as shown in FIG. 14. In this case, the control voltage in which the detected power of the power detector 1103 has its minimum value can be determined as equation 15.

$$V_{C\_\min} = \frac{-b}{2a} \quad \text{[Equation 15]}$$

According to another embodiment of the present invention, the output voltage or power can be detected directly on the output terminal without the power detector 1103 on the input terminal. FIG. 15 shows an embodiment in which the mismatching is compensated by directly measuring the output voltage and power.

IMPLEMENTATION EXAMPLE

Now, an implementation example is described.

The separator has the function of separating the signal from the input terminal to two signal paths. For example, two lines connected in the form of Y character cay be used as the separator 801. Or, impedance matching circuit may be used in the separator.

For the first mixer 807 and the second mixer 809, any circuit which can operate as a mixer can be user.

A flip-flop circuit can be used as the phase transformer. The flip-flop circuit used in the present invention outputs the signal having the same phase as the input signal and the signal having the different phase of 180 degree from the input signal.

Operational amp (OP Amp) element can be used as the subtractor 811. Especially, constituting the OP Amp to have negative feedback outputs the differential signal between two input signals of OP Amp.

FIG. 18 shows an embodiment in which an IQ mixer circuit is made of the unit mixer of the mixer circuit of the present invention. The IQ mixer circuit shown in FIG. 18 comprises a same phase signal circuit part (shown in the lower part of FIG. 18) and a orthogonal phase signal circuit (shown in the upper part of FIG. 18) part both of which have the constitutions of the first embodiment or the second embodiment according to the present invention. The same phase signal circuit part has the constitutions of the mixer circuit according to the present invention and includes a first mixer 1801 and a second mixer 1803. In addition, the orthogonal phase signal circuit part has the constitutions of the mixer circuit according to the present invention and includes a third mixer 1805 and a fourth mixer 1807. The local frequency signal and the signal in which the local frequency signal is phase transformed by 90 degrees are applied to the same phase signal circuit part and the orthogonal phase signal circuit part, respectively. The mixer circuit according to the present invention can be widely utilized as a unit mixer which compensates the shortcomings of the directly transform mixer circuit.

FIG. 19 shows the embodiment of the IQ mixer circuit made of the embodiment having differential output as a unit mixer among the mixer circuits according to the present invention. Especially, the circuit shown in FIG. 19 uses a differential amplifier 1901 for the circuit shown in FIG. 18. Moreover, the same phase signal circuit part, for example, uses two subtractors 1903 and 1905 having differential inputs to output differential output to control the common mode noise.

INDUSTRIAL APPLICABILITY

According to the present invention, only the desired baseband signals which is included in the frequency signals modified by the carrier signal, and the LO signal component which is not desired is scarcely included in the output signal for the mixing circuit mixing the radio frequency signal modified by the carrier wave of radio frequency and LO frequency signal. That is, DC offset problem is considerably reformed.

Moreover, LO signal component is hardly leaked to the radio frequency input terminal by using the circuits having excellent symmetric characteristic such as MOSFET.

It is possible to offset for the first differential function value gm' of the transconductance to have a maximum value among the non-linearities of the active element by using the active elements which are complementary with each other. This means that IMD2 is improved. Therefore, the even function non-linearity is considerably reformed according to the present invention.

Moreover, according to the present invention, only the desired baseband signals which is included in the frequency signals modified by the carrier signal, and the LO signal component which is not desired is scarcely included in the output signal for the mixing circuit mixing the radio frequency signal modified by the carrier wave of radio frequency and LO frequency signal. That is, even order noise is removed, and DC offset problem is considerably reformed. In addition, it is suppressed for the local frequency signal to leak to the input terminal.

The ability to decreasing DC offset is more elevated by equipped with the mismatching measuring and compensation means for reducing the DC offset or LO component due to the phase mismatching and the gain mismatching of the circuit according to the present invention. The common mode noise can be suppressed by constituting the mixer to the structure which is able to output the differential outputs and providing two subtractors.

The invention claimed is:

1. A mixer circuit comprising:
   a first circuit including a first active element and a second active element; and
   a second circuit including a third active element and a fourth active element,
   each of the first through the fourth active elements having a first terminal, a second terminal, and a third terminal,
   the amount and the direction of the current flowing from the second terminal to the third terminal being changed based on the voltage applied between the first terminal and the second terminal,
   the second terminals of the first active element and the second active element being connected to each other and connected to a second power supply via a first bias and impedance part of the second terminal side, and the second terminals of the third active element and the fourth active element being connected to each other and connected to the second power supply via a second bias and impedance part of the second terminal side,
   the first terminals of the first active element and the fourth active element being respectively connected to a first input terminal and a second input terminal, and the first terminals of the second active element and the third active element being connected to each other and connected to a third input terminal,
   the first input terminals of the first through fourth active elements being respectively connected to a first voltage via the first bias and impedance parts, to maintain a prescribed operational bias voltage,
   the connection point of the third terminal of the first active element and the third active element being connected to a first power supply via a first output terminal and a bias and impedance part of the first output side, and the connection point of the third terminal of the second active element and the fourth active element being connected to a first power supply via a second output terminal and a bias and impedance part of the second output side, and
   the first terminal of the fourth active element being connected to an LO frequency input terminal.

2. The mixer circuit of claim 1, wherein the signal modified by a carrier wave having a prescribed radio frequency is inputted to the first input terminal, the signal in which the signal inputted to the first input terminal is reversed is inputted to the second input terminal and a local oscillator signal is inputted to the third input terminal.

3. The mixer circuit of claim 1, wherein a local oscillator signal is inputted to the first input terminal, the signal in which the signal inputted to the first input terminal is reversed is inputted to the second input terminal, and the signal modified by a carrier wave having a prescribed radio frequency is inputted to the third input terminal.

4. The mixer circuit of claim 1, wherein the first power supply is a voltage power supply supplying a prescribed positive voltage, and the second power supply is earthed.

5. The mixer circuit of claim 1, wherein the first power supply is earthed, and the second power supply is a voltage power supply supplying a prescribed negative voltage.

6. The mixer circuit of claim 1, wherein the signal in which an information signal is modified by a prescribed radio frequency carrier wave is inputted to a first radio frequency input terminal and a second radio frequency input terminal and an LO signal having frequency of a half of the frequency of the radio frequency carrier wave is inputted to the LO signal input terminal.

7. The mixer circuit of claim 1, wherein each of said first through fourth active elements further has a fourth terminal, and said fourth terminals are connected to said first power supply via a prescribed bias and impedance circuit to maintain a operational bias voltage.

8. The mixer circuit of claim 7, wherein said first through fourth active elements are MOSFETS, and said first terminal, second terminal, third terminal and fourth terminal are gate, source, drain, and body terminal respectively.

9. The mixer circuit of claim 1, wherein said first through fourth active elements are MOSFETS, and said first terminal, second terminal, and third terminal are gate, source, and drain, respectively.

10. A mixer circuit comprising:
    a first type circuit part comprising a first circuit including a first active element and a second active element and a second circuit including a third active element and a fourth active element, each of the first through the fourth active elements having a first terminal, a second terminal, and a third terminal, and the amount and the direction of the current flowing from the second terminal to the third terminal being changed based on the voltage applied between the first terminal and the second terminal; and
    a second type circuit part comprising a first circuit including a first active element and a second active element of a second type complementary to the first type and a second circuit including a third active element and a fourth active element of a second type,
    the second terminals of the first active element and the second active element of the first type being connected to each other and connected to a second power supply via a first bias and impedance part of the second terminal side of the first type, the second terminals of the third active element and the fourth active element of the first type being connected to each other and connected to a second power supply via a second bias and impedance part of the second terminal side of the first type, the second terminals of the first active element and the second active element of the second type being connected to each other and connected to a first power supply via a first bias and impedance part of the second terminal side of the second type, and the second terminals of the third active element and the fourth active element of the second type being connected to each other and connected to a second power supply via a second bias and impedance part of the second terminal side of the second type, the connection point of the first terminals of the first active elements of the first type and second type and the connection point of the first terminals of the fourth active elements of the first type and second type being respectively connected to a first radio frequency input terminal and a second radio frequency input terminal, and the first terminals of the second active element and the third active element of the first type and the second type being connected to each other and connected to a local oscillator (LO) signal input terminal, the first terminals of the first active element through the fourth active element of the first type and second type being connected to a first voltage via a first bias and impedance part through a fourth bias and impedance part of first type first input terminal side and a first bias and impedance part through a fourth bias and impedance part of second type first input terminal side, respectively, to maintain a prescribed operational bias voltage, the connection point of the third terminals of the first active element and the third active element of the first type and second type being connected to a first power supply via a first output terminal and a bias and impedance part of the first output side, and the connection point of the third terminals of the second active element and the fourth active element of the first type and second type being connected to a first power supply via a second output terminal and a bias and impedance part of the second output side.

11. The mixer circuit of claim 10, wherein the first power supply is a voltage power supply supplying a prescribed positive voltage, and the second power supply is earthed.

12. The mixer circuit of claim 10, wherein the first power supply is earthed, and the second power supply is a voltage power supply supplying a prescribed negative voltage.

13. The mixer circuit of claim 10, wherein the signal in which an information signal is modified by a prescribed radio frequency carrier wave is inputted to the first radio frequency input terminal and the second radio frequency input terminal and an LO signal having frequency of a half of the frequency of the radio frequency carrier wave is inputted to the LO signal input terminal.

14. The mixer circuit of claim 10, wherein each of the first through fourth active elements of the first type and second type further has a fourth terminal, and the fourth terminals are connected to the first power supply via a prescribed bias and impedance circuit to maintain a operational bias voltage.

15. The mixer circuit of claim 14, wherein the first through fourth active elements are MOSFETS, and the first terminal, second terminal, third terminal, and fourth terminal are gate, source, drain, and body terminals, respectively.

16. The mixer circuit of claim 15, wherein the first through fourth active elements of the first type are N-type MOSFETS, and the first through fourth active elements of the second type are P-type MOSFETS.

17. The mixer circuit of claim 10, wherein the first differential equation of the transconductance of the current flowing from the third tenninal to the second terminal for the voltage between the first terminal and the second terminal of the first through fourth active elements of the first type has a maximum value, the first differential equation of the transconductance of the current flowing from the third terminal to the second terminal for the voltage between the first terminal and the second terminal of the first through fourth active elements of the second type has a minimum value, and all of bias and impedance circuits make the maximum value region of the first through fourth active elements of the first type and the minimum value region of the first through fourth active elements of the second type offset each other.

18. The mixer circuit of claim 10, wherein the first through fourth active elements of the first type and second type are MOSFETS, and the first terminal, second terminal and third terminal are gate, source and drain, respectively.

19. The mixer circuit of claim 18, wherein the first through fourth active elements of the first type are N-type MOSFETS, and the first through fourth active elements of the second type are P-type MOSFETS.

20. The mixer circuit of claim 10, wherein the first through fourth active elements of only one type out of the first and second type are substantially activated.

* * * * *